(12) United States Patent
Shingu et al.

(10) Patent No.: US 6,710,238 B1
(45) Date of Patent: Mar. 23, 2004

(54) THERMOELECTRIC MATERIAL AND METHOD FOR MANUFACTURING THE SAME

(75) Inventors: Hideo Shingu, Kyoto (JP); Keiichi Ishihara, Takatsuki (JP); Nobuyoshi Imaoka, Fuji (JP); Isao Morimoto, Fuji (JP); Shozo Yamanaka, Fuji (JP)

(73) Assignee: Asahi Kasei Kabushiki Kaisha

( * ) Notice: Subject to any disclaimer, the term of this patent is extended or adjusted under 35 U.S.C. 154(b) by 59 days.

(21) Appl. No.: 09/980,906
(22) PCT Filed: Jun. 2, 2000
(86) PCT No.: PCT/JP00/03610
  § 371 (c)(1),
  (2), (4) Date: Dec. 2, 2001
(87) PCT Pub. No.: WO00/76006
  PCT Pub. Date: Dec. 14, 2000

(30) Foreign Application Priority Data

Jun. 2, 1999 (JP) .............................. 11-155724

(51) Int. Cl.⁷ .......................... H01L 35/30; H01L 35/38; H01L 35/34; H01L 35/12
(52) U.S. Cl. .................... 136/205; 136/201; 136/236.1; 136/203
(58) Field of Search ................................ 136/200, 201, 136/203, 205, 236.1

(56) References Cited

FOREIGN PATENT DOCUMENTS

| JP | 62247578 A | 10/1987 |
|---|---|---|
| JP | 63043381 A | 2/1988 |
| JP | 06265414 A | 9/1994 |
| JP | 06-265414 * | 9/1994 |
| JP | 8-505736 | 6/1996 |
| JP | 10256611 A | 9/1998 |
| WO | WO94/16465 | 7/1994 |

OTHER PUBLICATIONS

L. D. Hicks, Effect of quantum–well structures on the thermoelectric figure of merit, *Physical Review B*, vol. 47, No. 19, pp. 12 727–12 731, May 15, 1993.
R. Venkatasubramanian and T. Colpitts, Enhancement in Figure–of–Merit with Superlattice Structures for Thin–Film Thermoelectric Devices, *Mat. Res. Soc. Symp. Proc.*, vol. 478, 1997, p. 73–84.
Yamaguchi et al., Energy Recovery of Thermal Power Plant by Thermoelectric Conversion Element, *Thermoelectric Conversion Symposium 1999 (Aug. 6, 1999, Tokyo) Memoirs*, issued Jul. 31, 1999 (with translation of relevant p. 45).
Chairman Kajikawa, Higher Performance in Element and Modularizing Technique, *IEEJ Technical Report No. 624*, Issued Apr. 1, 1997, The Institute of Electrical Engineers of Japan (translation of relevant pp. 35 and 36).

* cited by examiner

Primary Examiner—Patrick Ryan
Assistant Examiner—Thomas H. Parsons
(74) Attorney, Agent, or Firm—Dickstein, Shapiro, Morin & Oshinsky, LLP.

(57) ABSTRACT

A thermoelectric material having a high Seeback coefficient and a large power factor and excellent in shock resistance, thermal strain resistance, and formability, and a thermoelectric element are disclosed. The thermoelectric material and thermoelectric element is composed of a multilayered body made up of a laminar body of a semimetal, a metal, or a synthetic resin and a laminar body of a semimetal. The average thickness of the laminar bodies ranges from 0.3 nm to 1000 nm. Embodiments of the combination of the laminar bodies are Bi—Al, Bi-polyamide series resin, and Ag—Fe. Such a multilayered body is manufactured by forming an initial multilayered body composed of all the types of laminar bodies constituting the multilayered body and rolling or uniaxially pressing a stack of such initial multilayered bodies.

18 Claims, 12 Drawing Sheets

10 μm

10 μm

THERMOELECTRIC MATERIAL AND METHOD FOR MANUFACTURING THE SAME

TECHNICAL FIELD

The present invention relates to a thermoelectric element used for a cooling system and a temperature controller utilizing a Peltier effect, a power generator for generating electricity using a Seebeck effect of a temperature difference, a thermocouple using thermoelectromotive force, and a variety of sensors and so on, and concerns a thermoelectric material making up the thermoelectric element and a method for manufacturing the thermoelectric material.

BACKGROUND ART

When different types of semiconductors are connected to form an electric circuit and direct current is applied, a junction produces heat and the other junction absorbs heat. This phenomenon is called a Peltier effect. Electronic cooling on a target by using a Peltier effect is called thermoelectric cooling, a device formed for this object is called a thermoelectric cooling element or a Peltier element in general. Further, when a temperature difference appears between two junctions, electromotive force is generated according to the temperature difference. The phenomenon is called a Seebeck effect, and power generation using generated electromotive force is called thermoelectric power generation.

Moreover, a sensor is called a thermocouple, which senses a temperature difference between two bonding parts by bonding different types of metal to form an electric circuit and measuring thermoelectromotive force appearing between two bonding parts. In addition to the thermocouple, a variety of sensors using a Seebeck effect include a device, a module, or a system for obtaining a change in a quantity of intensive property (intensity variable) by sensing the temperature difference by a potential difference, the change having one-to-one correspondence with a temperature difference, and for giving feedback to a variety of functions.

Such a different type of metal or an element having a basic configuration for connecting a semiconductor is generally called a thermoelectric element, and metal or a semiconductor used for the element with a high thermoelectric performance is called a thermoelectric material.

Since thermoelectric cooling is causing a solid element, it is characterized In that no toxic refrigerant gas is necessary, no noise occurs, and partial a cooling is possible. Besides, since heating is possible due to a Pertier effect by switching a direction of current, a temperature can be regulated with accuracy. Applications using such characteristics, include the following: cooling and precise temperature regulation of an electronic component and temperature control of a storage cabinet such as a wine cooler, in which temperature control is important. When a thermoelectric material with high performance is used at room temperature, it is possible to achieve a refrigerator and a freezer without using any toxic gas such as a CFC.

Meanwhile, thermoelectric power generation realizes effective use of energy that includes power generation using waste heat from a heat engine such as a factory, a power plant, and a vehicle, and power generation using abundant solar energy. Further, a metallic thermoelectric material with large thermoelectromotive force and a small resistance has a high usage value as a temperature sensor such as a thermocouple having a high sensitivity.

High performance of a thermoelectric element is generally indicated by a fact that any one of thermoelectromotive force (V), a Seebeck coefficient ($\alpha$), a Peltier coefficient ($\pi$), a Thomson coefficient ($\tau$), a Nernst coefficient (Q), an Ettingshausen coefficient (P), electrical conductivity ($\sigma$), a power factor (PF), a figure of merit (Z), and a dimensionless figure of merit (ZT) is high, or any one of a thermal conductivity ($\kappa$), a Lorentz number (L), and a electrical resistivity ($\rho$) is low. The above performances of a thermoelectric element are called a variety of thermoelectric performances. Additionally, a Seebeck coefficient is also called thermoelectric power.

Particularly, a dimensionless figure of merit (ZT) is indicated by $ZT = \alpha^2 \sigma T/\kappa$ (here, T indicates an absolute temperature) and is an important element for determining efficiency of thermoelectric conversion energy such as a coefficient of performance in thermoelectric cooling and conversion efficiency in thermoelectric power generation. Therefore, it is possible to increase efficiency of cooling and power generation by using a thermoelectric material with a large figure of merit ($Z = \alpha^2 \sigma T/\kappa$) to form a thermoelectric element.

Namely, as a thermoelectric material, a material having a large Seebeck coefficient ($\alpha$) is preferable. Further, a material having a large electrical conductivity and a large power factor accordingly ($PF = \alpha^2 \sigma$) is particularly preferable. Besides, a material having a low thermal conductivity ($\kappa$) is the most preferable. Moreover, in other words, a material is preferable which has a large Seebeck coefficient ($\alpha$) and a large ratio $\sigma/\kappa$ (=1/TL; mainly in the case of metal) of an electrical conductivity and a thermal conductivity.

However, as long as a single thermoelectric material is used by a conventional method, a figure of merit (Z), particularly a power factor (PF) and a Seebeck coefficient ($\alpha$) are substantially determined by a kind of an element making up the material and a composition ratio thereof. Thus, any material has not been found which remarkably exceeds a conventionally used thermoelectric semiconductor $Bi_2Te_3$, PbTe, or Si—Ge in various thermoelectric capabilities.

Therefore, it has been considered that a dimensionless figure of merit (ZT) is improved by forming a multilayered structure by using a thin-film forming technique such as MBE (Molecular Beam Epitaxy) method and CVD (Chemical Vapor Deposition) method. In recent studies, a two-dimensional quantum well structure (National Publication of the Translated Version of PCT Application No. 8-505736 discloses a theoretical study (L. D. Hicks and M. S. Dresselhaus, Phys. Rev. B, 47, (1993) p12727), in which regarding a $Bi_2Te_3$ semiconductor, a dimensionless figure of merit (ZT) is about seven times larger than that of a bulk material by confining a charge carrier (electron and hole) in a two-dimensional manner. The improvement of a figure of merit (Z) is proved in an experiment as well.

Moreover, another proposal (R. Venkatasubramanian and T. Colpitts, Materials Research Society Symposium Proceedings Vol. 478(1997) p73) is made as follows: when a number of interfaces exist like a superlattice structure, in which the interfaces are brought into contact with layers each being made of a different material with a thickness of about several tens nm, since phonon used for thermal conduction is scattered on the interfaces, a thermal conductivity is made smaller than that of a bulk material.

However, in order to manufacture a repeated multilayered structure having a constant quantum size to improve a performance index or a dimensionless performance index by using the above techniques, it is necessary alternately stack films on the order of nm with the MBE method and the CVD method. Thus, a film-forming speed is slow and is disadvantageous in industry. To be specific, generally as shown in FIG. 1, a thermoelectric element is configured such that both ends of a P-type semiconductor and an N-type semiconductor are sandwiched by metallic electrodes. A somewhat large thickness is necessary for the semiconductor because heat returns from a high-temperature electrode to a low-temperature electrode. For example, at a film-forming speed of 0.02 µm/minute, a continuous film-forming process of about a week is required for forming a thermoelectric material having a quantum well structure with a thickness of 200 µm.

In the application for thermoelectric power generation, a material having a large power factor as well as a large figure of merit may be required. A performance index (Z) is a value obtained by dividing a power factor (PF=$\alpha^2\sigma$) by a thermal conductivity ($\kappa$). When $\kappa$ is small, a figure of merit is increased as for the same power factor. However, when $\kappa$ is too small, since an element is inserted on a part having a temperature difference, a thermal resistance rises, resulting in an entirely large system and increased capital cost and operating cost. For example, see "Yamaguchi et al., Thermoelectric conversion symposium 1999 (Aug. 6, 1999, Tokyo) memoirs, p. 44".

As a material used for a variety of sensors, a high Seebeck coefficient is demanded for increasing a detecting sensitivity and precision, and a metallic thermoelectric material such as Alumel-Chromel and platinum-rhodium is usually used. Since the material is made up of only precious metal or uses a multicomponent alloy, manufacturing cost for maintaining the material cost and stable performance is high.

As described above, regarding a thermoelectric material, it is necessary to achieve a high Seebeck coefficient and a high power factor increasing accordingly so as to improve a figure of merit. Additionally, shock resistance, thermal strain resistance, and formability are required at the same time.

Incidentally, a thermoelectric power generation element generates electricity by using a temperature difference between a high-temperature side and a low-temperature side. Further, a thermoelectric cooling element has a function of shifting a quantity of heat from a low-temperature side to a high-temperature side. Thus, as described above, the element is inserted on a part having a temperature difference. Therefore, a difference in thermal expansion appears between the low-temperature side and the high-temperature side and thermal shearing stress is generated inside the element.

Furthermore, as the thermoelectric cooling element, a $Bi_2Te_3$ semiconductor is currently used. When soldering is used for electrical connection on the high-temperature side, a particle mass of solder structure is oversized and uneven thermal shearing stress appears inside the element (Chairman Kajikawa, IEEJ Technical Report No. 624, 1997, The Institute of Electrical Engineers of Japan, p. 35). Because of the occurrence of such shearing stress, the lifetime of the thermoelectric semiconductor element of a heat cycle is extremely shortened.

Conventionally, in response to application, even at the expense of a variety of thermoelectric performances a variety of element configuration has been proposed, which includes the use of a thermoelectric semiconductor material of a melted polycrystal and powder sintered body that is relatively resistant against shearing stress without cleavability and includes making connection. However, the above proposals are disadvantageous in cost performance because the process and configurations are complicated. A thermoelectric material being resistant against the thermal shearing stress has been demanded.

Also, as a material of an element used for thermoelectric power generation and thermoelectric cooling, a semiconductor material has been conventionally used without exception. Therefore, the element is brittle and cracking or chipping is likely to appear. When cutting is made to form a small shape such as a 2 mm cube and 0.6 square×1.3 mm, a yield is poor in the process or quality is less prone to being guaranteed in application in which a number of vibrations or shocks occur.

As described above, when a semiconductor material is used, it is not possible to complicate the shape of a thermoelectric element. Thus, as for a conventional thermoelectric material, it is not possible to obtain sufficient efficiency, for example, when the shape of a thermoelectric element is formed to be mounted in a pipe such as a cylinder having a curvature in order to reasonably dispose a thermoelectric material on an existing heat engine or when it is hard to use a flat-shaped thermoelectric element or module for other reasons on design.

The problem of the present invention is to provide a thermoelectric material in which high performance is expected as a thermoelectric element, namely, a Seebeck coefficient ($\alpha$) is high and a power factor (PF) is large, with excellent shock resistance, thermal strain resistance, and formability.

DISCLOSURE OF THE INVENTION

In order to solve the above-mentioned problems, the present invention provides a thermoelectric material, which is composed of a multilayered body including at least one or more laminar bodies of a semimetal, a metal, or a synthetic resin, and a laminar body of a semimetal, and an average thickness of the laminar bodies ranges from 0.3 nm to 1000 nm. The thermoelectric material is defined as a first thermoelectric material.

In the present invention, "semimetal" includes bismuth (Bi), antimony (Sb), tellurium (Te), and selenium (Se). Since silicon (Si) and germanium (Ge) are semiconductors and carbon (C) and boron (B) have insufficient spreadability, they are not used in the present invention.

As the metal, it is possible to adopt a metal having spreadability that includes iron (Fe), silver (Ag), copper (Cu), nickel (Ni), aluminum (Al), gold (Au), platinum (Pt), chromium (Cr), cobalt (Co), a rare-earth element, zinc (Zn), indium (In), lead (Pb), and tin (Sn), or solid solution of these metals.

The following materials are used as synthetic resins. A polyamide series resin such as 12-nylon, 6-nylon, 6,6-nylon, 4,6-nylon, 6,12-nylon, amorphous polyamide, and semi-aromatic polyamide. A polyolefin series resin such as polyethylene and polypropylene. A polyvinyl series resin such as polyvinyl chloride, polyvinyl acetate, polyvinylidene chloride, polyvinyl alcohol, and an ethylene-vinyl acetate copolymer.

An acrylic series resin such as an ethylene-ethyl acrylate copolymer and polymethyl methacrylate. An acrylonitrile series resin such as polyacrylonitrile and an acrylonitrile/butadiene/styrene copolymer. A polyurethane series resin. A fluorine series resin such as polytetrafluoroethylene.

A synthetic resin referred to as an engineering plastic such as polyacetal, polycarbonate, polyimide, polysulfone, polybutylene terephthalate, polyarylate,polyphenyleneoxide, polyether sulfone, polyphenyl sulfide, polyamide imide, polyoxybenzylene, and polyether ketone.

A thermoplastic resin including a liquid crystal resin such as all aromatic polyesters. A conductive polymer such as polyacethylene. A thermosetting resin such as an epoxy resin, a phenolicplastic, an epoxy-modified polyester resin, a silicon resin, and a thermosetting acrylic resin. A nitrile rubber, a butadiene-styrene rubber, a butyl rubber, a nitrile rubber, a polyurethane rubber, and an elastomer such as polyamide elastomer.

Further, the present invention provides a thermoelectric material which is composed of a multilayered body made up of a laminar body of a semimetal and a laminar body of metal, and the laminar bodies have an average thickness of 0.3 nm to 1000 nm. The thermoelectric material is defined as a second thermoelectric material.

In the thermoelectric material, the laminar bodies made of metal can be made of any of the above-mentioned metals. The laminar body is preferably made of one of the metals including Ag, Fe, Cu, Ni, Al, Au, Pt, Cr, Zn, Pb, and Sn. The obtained multilayered body by using these metals can be remarkably excellent in formability and electric conductivity.

In the thermoelectric material, it is preferable that the laminar body made of semimetal is a laminar body of bismuth (Bi) and the laminar body made of metal is a laminar body of a metal selected from Ag, Fe, Cu, Al, Zn, and Sn. The reason will be discussed below.

Since Bi is a material having relatively good plasticity among semiconductors, a Seebeck coefficient and a power factor are particularly increased. Further, Bi does not form a full ratio solid solution and an intermetallic compound with Ag, Fe, Cu, Al, Zn, or Sn both at room temperature and a rolling temperature. Therefore, when rolling or uniaxially pressing is adopted as a manufacturing method, it is possible to readily obtain a multilayered body with good thermoelectric performance.

In this second thermoelectric material amorphous phase may appear on an interface layer of the laminar bodies being adjacent to each other in the multilayered body and a microcrystal of a metal or a semimetal on one of the laminar bodies may be finely dispersed on the other phase to cause a mixed phase. It is considered that the presence of these phases contributes to the function of improving a power factor. However, the mechanism has not been found at this moment.

The present invention provides a thermoelectric material which is composed of a multilayered body made up of a laminar body of a semimetal and a laminar body of a synthetic resin, and the laminar bodies have an average thickness of 0.3 nm to 1000 nm. The thermoelectric material is defined as a third electric material.

The thermoelectric material is a thermoelectric material with strong bending stress and shearing stress due to flexibility of the laminar bodies made of synthetic resin. Namely, as compared with a conventional thermoelectric material composed of semiconductors, the above thermoelectric material is far more excellent in shock resistance and thermal strain resistance and also has much formability. Moreover, the above thermoelectric material can be readily cut with a cutter and scissors and a cutting face is not likely to lose its shape.

Also, since the laminar body made of synthetic resin is provided, a complicated shape is available as compared with a conventional thermoelectric material composed of semi- conductors. For example, the thermoelectric material can be also disposed on a pipe such as a cylinder with a curvature. Thus, it is possible to increase a degree of freedom on design. Besides, the thermoelectric material has high durability even in the event of thermal hysteresis.

In the thermoelectric material, the synthetic resin can be selected from the above-mentioned synthetic resins. A polyamide series resin, polyethylene, polypropylene, and an elastomer are preferable. A polyamide series resin is particularly preferable. Therefore, it is possible to obtain the multilayered body which is excellent in all of strength, flexibility, and durability.

Moreover, as described above, Bi is relatively good in plasticity among semimetals. Thus, it is preferable to use Bi as a semimetal for the first and third thermoelectric materials. Hence, a Seebeck coefficient and a power factor are particularly increased.

In the first to third thermoelectric materials, an average thickness of the laminar bodies ranges from 0.3 nm to 1000 nm. When the value is less than 0.3 nm, interface energy between the laminar bodies rapidly rises. Thus, the material becomes thermally unstable. When the value exceeds 1000 nm, sufficiently high thermoelectric performance cannot be achieved.

In these thermoelectric materials, an average thickness of the laminar bodies is preferable at 0.3 nm to 100 nm and more preferable at 1 nm to 50 nm.

The multilayered body is composed of the laminar body made of a synthetic resin, which is extremely low in electric conductivity, and the laminar body made of Bi, and a thickness of the semimetal layer ranges 0.3 to 10 nm, in the third thermoelectric material. Such multilayered body is expected to lower a dimension of a carrier state density, thereby remarkably improving thermoelectric power. In order to achieve such a multilayered body, it is necessary to carefully devise a flatness ratio of the laminar bodies, control of the multilayered structure, and conditions such as rolling and heating.

When an average thickness of the laminar bodies making up the multilayered body is at 10 to 1000 nm, preferably at 10 to 100 nm, it is possible to improve flexibility and a Seebeck coefficient or to reduce a thermal conductivity at the same time. In this case, it is not necessary to reduce a thickness of each of the laminar bodies to several nm.

The first to third thermoelectric materials also include a multilayered body composed of all of a laminar body made of a semimetal, a laminar body made of a metal, and a laminar body made of a synthetic resin. The multilayered body can serve as a thermoelectric material being particularly excellent both in thermoelectric performance and formability.

Further, the present invention provides thermoelectric elements composed of the first to third themoelectric materials. The thermoelectric elements are preferably used by applying current in a thickness direction of the multilayered body or are preferably used by making a temperature difference between both ends in a thickness direction of the multilayered body.

Moreover, the present invention provides a thermoelectric element, which is composed of a multilayered body made up of two or more kinds of laminar bodies made of a metal and the laminar bodies have an average thickness of 0.3 nm to 100 nm, and which is used by applying current in a thickness direction of the laminar body or used by making a temperature difference between both ends in a thickness direction of the multilayered body.

In the above thermoelectric element, when an average thickness of the laminar bodies is less than 0.3 nm, since interface energy rapidly rises between the laminar bodies. Thus, the material becomes thermally unstable. When the value exceeds 100 nm, sufficiently high thermoelectric performance cannot be achieved.

In the thermoelectric element, an average thickness of the laminar bodies is preferable at 1 nm to 50 nm.

In the thermoelectric element, the laminar body can be made of any of the above-mentioned metals. However, the laminar body is preferably made of metals including Ag, Fe, Cu, Ni, Al, Au, Pt, Cr, Zn, Pb, and Sn. The obtained multilayered body is excellent particularly in formability and electric conductivity by using these metals.

In the thermoelectric element, the multilayered body is preferably composed of a laminar body made of any one of metals including Fe, Ni, Al, Pt, Cr, and Sn and a laminar body made of any one of metals including Ag, Cu, Au, Zn, and Pb. The reason will be discussed.

As shown in the following equation (1), a Seebeck coefficient $\alpha$ is generally expressed by a sum of an electronic diffusion term $\alpha_e$, a phonon-drag term $\alpha_{ph}$, and a term $\alpha_{mag}$ associated with the interaction with magnetic spin.

$$\alpha = \alpha_e + \alpha_{ph} + \alpha_{mag} \quad (1)$$

A multilayered body, which is composed of one or more kinds of a laminar body made of a material having magnetic spin such as paramagnetism and ferromagnetism or a material such as Fe, Ni, Al, Pt, Cr, and Sn having a negative magnetic susceptibility of $\chi$, can improve a Seebeck coefficient by the term of $\alpha_{mag}$. Further, a multilayered body, which is composed of the laminar body and a laminar body made of a material such as Ag, Cu, Au, Zn, and Pb having a positive magnetic susceptibility of $\chi$, is used by applying current in a thickness direction of the multilayered body. Or when the thermoelectric element is used by making a temperature difference between both ends in a thickness direction of the multilayered body, a particularly good Seebeck coefficient can be obtained.

Moreover, the combination of Ag—Ni having a positive and negative Seebeck coefficient as an element at room temperature or the combination having a positive and negative Seebeck coefficient in an ambient temperature region is preferable in some configurations of the multilayered body.

Also, regarding a method of manufacturing the themoelectric material composed of a multilayered body made up of two or more laminar bodies each having an average thickness value of 0.3 nm to 1000 nm, the present invention provides a method of manufacturing the thermoelectric material, in which after forming initial multilayered bodies each being composed of all kinds of laminar bodies making up the multilayered body, a plurality of the initial multilayered bodies are stacked and subjected to rolling or uniaxially pressing to form the multilayered body.

In the above manufacturing method, it is preferable to stack a plurality of second multilayered bodies, which are obtained by stacking a plurality of the initial multilayered bodies and perform rolling or uniaxially pressing thereon, and to perform rolling or uniaxially pressing thereon once or more than once.

In these manufacturing methods, it is preferable to use powder having an average particle diameter of 0.1 μm to 500 μm and to form the initial multilayered bodies after pre-sintering the powder.

The multilayered bodies making up the thermoelectric material of the present invention can be manufactured by these manufacturing methods. The manufacturing method of the present invention makes it possible to manufacture multilayered bodies having an average thickness of 200 μm or more. Namely, according to the manufacturing method of the present invention, it is possible to manufacture the multilayered bodies for the thermoelectric element shown in FIG. 1.

The thermoelectric element and the thermoelectric material of the present invention also includes a thermoelectric element and a thermoelectric material in which laminar bodies making up the multilayered body are discontinuous in a film surface. The thermoelectric element and the thermoelectric material can achieve a variety of high thermoelectric performances even when the laminar bodies making up the multilayered body are discontinuous in a film surface. The multilayered body is manufactured by, for example, the manufacturing method of the present invention. The multilayered body manufactured by a thin-film forming technique such as MBE method and CVD method is usually made up of continuous laminar bodies in a film surface.

(With Respect to Laminar Body)

The thermoelectric element of the present invention is composed of the multilayered bodies. An average thickness of the laminar bodies making up the multilayered body ranges 0.3 nm to 1000 nm. When the multilayered body is manufactured by the above method performing rolling or uniaxially pressing, a thickness of the laminar body is defined as follows.

Firstly, in the case of rolling, in FIG. 13 a plane $S_r$ or a surface in parallel with the plane $S_r$ is used as a reference surface. In the case of uniaxially pressing, a plane (plane $S_p$ is shown as an example in FIG. 14) in parallel with a pressing direction (direction of Z axis in FIG. 14) is used as a reference surface.

The laminar body of the multilayered body manufactured by the above method is considered to be an extremely flat rectangular parallelpiped or spheroid. When the laminar body is considered to be an extremely flat rectangular parallelpiped, a short side on a sectional view (rectangle) taken along the reference surface is defined as a thickness of the laminar body. When the laminar body is considered to be an extremely flat spheroid, a length twice a minor axis of a sectional view (oval) taken along the reference surface is defined as a thickness of the laminar body.

When the laminar body is considered to be an extremely flat rectangular solid, a flatness ratio of the laminar body is a ratio $(d/\sqrt{A})$ of the square root of a bottom area (A) of the rectangular parallelpiped to a height (d). In the present invention, a flatness ratio of the laminar body is preferable at $10^{-2}$ to $10^{-9}$.

When the laminar body is manufactured by the above method, a flatness ratio $\psi$ can be found from the above sectional view. When the laminar body is considered to be a flat rectangular parallelpiped, a ratio (d/1) of the short side (d) to a long side (1) of a rectangular equivalent to the sectional view is defined as a flatness ratio $\psi$. When the laminar body is considered as a flat spheroid, a ratio (b/a) of a minor axis (b) to a major axis (a) of an oval equivalent to the sectional view is defined as a flatness ratio $\psi$.

In the present invention, when the multilayered body is manufactured by the above method, a multilayered body having a flatness ratio $\psi$ of 0.2 to $10^{-11}$ is defined as a "laminar body".

Hereinafter, a "a multilayer body section" indicates a section taken near the center of the multilayered body on the reference surface ($S_r$, $S_p$, and so on). In general, on the laminar body section, the long side (1) of the rectangular or the major axis (a) of the oval is aligned a rolling direction or perpendicularly to a pressing direction.

When a flatness ratio is close to $\psi=1$, the laminar body section can be approximate to a square or a circle, and as a flatness ratio is closer to $\psi=0$, when the section is observed by a SEM or a TEM, both ends of the laminar body are less likely to enter a finite observed region. Thus, a laminar configuration having the laminar bodies aligned in parallel is observed.

The laminar body of the present invention has an average flatness ratio $\Psi$ in a layered product included the range within $0.2 \geq \Psi \geq 10^{-11}$. An average flatness ratio is preferable at $10^{-2} \geq \Psi \geq 10^{-11}$ in view of improvement of a Seebeck coefficient and a reduction in thermal conductivity, is preferable at $0.2 \geq \Psi \geq 10^{-9}$ in view of productivity, and more preferable at $10^{-2} \geq \Psi \geq 10^{-9}$. In the multilayered body composed of laminar bodies made of metals, an average flatness ratio $\Psi$ is preferable at 0.02 or less in view of improvement of a Seebeck coefficient.

When an average flatness ratio $\Psi$ is obtained, as a population, it is ideal to have a number sufficiently representative of the structure of the material on statistics. In many cases, it is possible to determine if an average flatness ratio $\Psi$ is within the above range or not by checking about ten $\psi$.

In the above manufacturing method of the present invention, it is usually unthinkable that the multilayered body is obtained such that a flatness ratio $\psi$ of the laminar body is $10^{-11}$ and an average flatness ratio $\Psi$ is also $10^{-11}$. The reason will be discussed. In rolling or uniaxially pressing method, a flatness ratio $\psi$ of the laminar bodies decreases mainly because the multilayered body is deformed along a slip plane. When a flatness ratio $\psi$ is $10^{-11}$, since a vast interface per unit volume is included, it is extremely difficult to have ideal deformation while all interfaces are kept in parallel with one another in a film surface direction at a final step of a rolling operation.

In the above manufacturing method of the present invention, the multilayered body section may be formed as a microstructure, in which one of two adjacent laminar bodies is regarded as a rectangular parallelpiped or a spheroid and the other laminar body is continuously distributed around the laminar body. In the microstructure, the multilayered body is manufactured by a rolling operation in which a material disposed in an actual space having a three-dimensional degree of freedom is strongly pressed in a specific uniaxially direction. Thus, a microstructure is formed in which longitudinal directions of the laminar bodies are aligned substantially in parallel with a rolling direction or substantially perpendicularly to a uniaxially pressing direction. Namely, the microstructure is considered to be a island-in-sea structure but is different from a configuration in which a structure isotropically makes microdispersion in a matrix.

Such special microstructure is one of the essential requirements for achieving the effects of the present invention and is the origin of anisotropy of the thermoelectric performance. Particularly in the combination of metals, unless an element configuration for applying current in a perpendicular direction to a film surface or a configuration using a potential difference appearing by having a temperature difference in a thickness direction, sufficient thermoelectric performance cannot be achieved.

Here, when a island-in-sea structure is observed, a thickness of an element that corresponds to continuous layers is provided in an arbitray perpendicular direction to a film surface direction, and a distance between the closest islands or a distance between an island and the end of the material is indicated by d. Of course, layers observed as continuous layers are considered to belong to a category of a laminar body, a flatness ratio of them is a ratio of a thickness of the continuous layers and a length of an observed region in a film surface direction (that is, of straight lines within the thickness d, a minimum value of a length of a segment divided by another layer in a perpendicular direction to a direction of measuring a thickness of the continuous layers) or when the multilayered body is considered as being continuous from one end to the other, a flatness ratio is a thickness of the continuous layers and a length of the entire multilayered body.

When it is necessary to count the number of laminar bodies, for example, when an average thickness of the laminar bodies is computed, even if traveling is possible along a space vector having components in a perpendicular direction to a film surface while avoiding a closed surface surrounding the laminar bodies corresponding to an island in a region, which can be recognized as a single layer, in the case where n gaps are provided between the laminar bodies corresponding to two islands in an arbitrary direction perpendicular to a film surface direction, n is considered as the number of layers. According to actual counting, the above thinking is the same as a method in which an arbitrary length u is set along a perpendicular direction to a film surface, the number m of interfaces is counted, and m is the number of layers in the thickness u, and u/m is an average thickness of the layers. Namely, in some cases, a region surrounded by the closed curved surface is counted as a plurality of layers.

As an extreme example, the following will discuss the case where two oval laminar bodies $L_1$ and $L_2$ are aligned and floated in a perpendicular direction to a film surface in a continuous matrix M (FIG. 2). In this case, when the number of layers is counted along a dotted line part (reference number 10) of FIG. 2, although the M part is a single continuous layer, three layers (three layers in total of reference numerals 7, 8, and 9 shown in FIG. 2) are not counted as a total number but total five layers of the end of a test sample -$L_1$, $L_1$, $L_1$-$L_2$, $L_2$, and $L_2$- the end of the test sample in total are computed as the number of all the layers.

The thinking on the laminar body or the microstructure in which a thickness of the layers is computed by m is quite reasonable when a factor for controlling thermoelectric performance is considered in the microstructure of the present invention having many laminar bodies are distributed with a large flatness ratio. For example, in the case of the present invention in which a Seebeck coefficient and a thermal conduction are largely dependent upon an area of an interface, it is preferable that an index of a total area of the interface is a thickness of the layers that is computed by u/in. For example, it is not practical to find how many continuous parts surrounded by the closed surface are there in the entire multilayered body. Of course, the above thinking cannot be established without a material in which a flatness ratio $\psi$ of 0.2 or less is smaller than 1 and the laminar bodies dominantly exist with longitudinal directions aligned along a film surface.

An average thickness :D of the laminar bodies of the present invention is computed by, for example, the following method. On sectional views of one or more multilayered bodies, N arbitrary segments with a length of $u_i$ are taken along a perpendicular direction to a film surface, the number $m_i$ of the interfaces is counted for each of the segments, and $u_i/m_i$ is taken as a thickness $d_i$ of the laminar body (i is a natural number of $1 \leq i \leq N$). Besides, actually, computation is made based on a photograph observed by a transmittance electron microscope (TEM) or a scanning electron microscope (SEM) on a cut surface or a polished surface and so on of the multilayered body section.

At this moment, segment ui is set so as to have $m_i \geq 10$, $u_i$ numbering N is necessary for sufficiently reflecting the entire structure. Thus, ten or more $u_i$ normally need to be selected from the section of the multilayered body.

$$d_i = u_i/m_i \ (m_i \geq 10) \tag{2}$$

$$D = \left(\sum_{i=1}^{N} d_i\right) \Big/ N (N \geq 10) \tag{3}$$

An average thickness D is computed according to the equations (2) and (3). However, when it is confirmed that a material has sufficiently even structure, $m_i \geq 10$ and $N \geq 10$ are not always required.

In the thermoelectric material and the thermoelectric element of the present invention, since an average thickness of the laminar bodies making up the multilayered body is limited to the above range, good thermoelectric performance can be obtained.

When an average thickness D of the laminar bodies making up the multilayered body is within the above range, a thickness d of the laminar body does not always need to be even. However, when the laminar bodies having the same composition are compared with each other, it is preferable that "a maximum thickness/a minimum thickness" ranges from 1 to 100 in a range for observing the multilayered body section used for computing the D. When "a maximum thickness/a minimum thickness" exceeds 100, the characteristics of the laminar body having a maximum thickness considerably affect the entire physical property. When both of a maximum thickness and an average thickness exceed 1000 nm, exceed 100 nm in the case of the multilayered body composed of only metals, the effect of the present invention cannot be sufficiently produced and remarkable improvement of a variety of the thermoelectric characteristics cannot be expected for a bulk material. "A maximum thickness/a minimum thickness" is preferable at 1 to 10.

The most ideal case is that the laminar bodies entirely cover a stacking surface of the thermoelectric material. However, the laminar bodies making up the thermoelectric material do not always need to form continuous bodies from one end to the other of the thermoelectric material but each part of the thermoelectric material only needs to form the multilayered configuration of the present invention. The multilayered body of the present invention is characterized in that even if discontinuity is found in the film surface, a variety of thermoelectric performances are sufficiently high. Further, even in the case where the configuration is not in parallel with the film surface but somewhat wavy, a variety of thermoelectric performances are exercised without any problems. Hence, it is possible to use the multilayered body by curving and bending.

(With Respect to Manufacturing Method)

The following will discuss a method of manufacturing the thermoelectric material of the present invention but an available method is not particularly limited to the following.

FIG. 3 is a flowchart showing the manufacturing method of the present invention. The manufacturing method of the present invention will be discussed according to the flowchart.

First, a method of manufacturing a precursor for multilayered body will be described according to the present invention.

When two or more kinds of powdered materials are used, the precursor for multilayered body is formed in one of the following steps (I) and (II) or both of the steps.

(I) Compression Molding Method

The material powder is subjected to (1) mixing (mixing step), (2) compression molding (compression molding step), and then (3) rolling (rolling step (product rolling step)) to form a precursor for multilayered body.

(II) Melt Molding Method

The material powder is subjected to (1) mixing (mixing step), (2') melt molding (melt molding step), and then (3) rolling (rolling step (product rolling step)) to form a precursor for multilayered body.

Further, the following methods are also available: a method of (1) mixing step (3) rolling step (product rolling step) to form the precursor for multilayered body without the compression molding step and the melt forming step, a method of (2) compression molding step (3) rolling step (product rolling step) to form the precursor for multilayered body without any mixing step, a method of (2') melt molding step→(3) rolling step (product rolling step) to form the precursor for multilayered body, and a method of performing the step including (2') the melt molding step after (2) the compression molding step to form the precursor for multilayered body.

Meanwhile, when the precursor for multilayered body is manufactured from a single kind of powder material to be used, it is possible to manufacture the precursor for multilayered body by omitting (1) mixing step and only performing (2) compression molding step→(3) rolling step (product rolling step), (2') melt molding step→(3) rolling step (product rolling step), and (2) compression molding step→(2') melt molding step→(3) rolling step (product rolling method), or (3) rolling step (product rolling step).

In the present invention, the powder material being capable of plastic deformation with a particle diameter of 0.1 μm to 500 μm is preferably used. When a particle diameter is less than 0.1 μm, compression molding or mixing is difficult. When a particle diameter exceeds 500 μm, the number of repeated rolling needs to increase to set a thickness of the laminar body within a suitable range. Thus, productivity is poor. Moreover, when excellent productivity is required, it is desirable to set an average powder diameter at 1 to 100 μm.

The following will discuss the detail of the steps for manufacturing the precursor for multilayered body using two or more kinds of powder material.

(1) Mixing Step

When mixing two or more kinds of powder material, as a method thereof, a typical mixer is applicable. The mixer is not particularly limited. It is possible to use an automatic mortar, a V-type mixer, a tumbler, a ribbon mixer, a rotary mixer, a Henschel mixer, a flash mixer, a Nauta mixer, a super mixer, and so on. In addition to a method of mixing commercial material powder by the above mixer, as a method of mixing with pulverization, crushing, and surface reforming, it is also effective use a pulverizer and a surface reformer such as a rotary ball mill, a vibration ball mill, a planetary ball mill, a wet mill, a jet mill, a cutter mill, and a hammer mill, and so on.

(2) Compression Molding Step

This method performs compression molding by hydraulic pressing and so on to temporarily manufacture a product. As compression molding, it is possible to adopt a method of filling powder into a mold and applying pressure in a uniaxial direction under constraint, a method of performing compression between molds in an open state except for a uniaxial direction, and CIP method of isotropically applying pressure.

It is more preferable to form the product into a shape readily compressed into a precursor for multilayered body, for example, a shape close to a flat rectanglar parallelpiped and disc that includes a plate, a strip, a ribbon, a sheet, a coin, and a button.

(2') Melt Molding Step

This method performs a melting operation on mixed powder material to form an ingot or a compound. As described above, the following method is frequently used: compression molding is performed on powder material by hydraulic pressing and so on, a product is temporarily manufactured, and a melting operation is performed. Further, all components may be melted or some of the components may be melted.

The melt molding is carried out as follows: powder material is filled or sealed into a boat made of a ceramic material (such as alumina and/or zirconia), a reducing material such as carbon, a metal (such as platinum, stainless steel, nickel, and aluminum), glass (such as hard glass, a pyrex, and quartz), a crucible, a tube, a reactor, a separable flask, and so on by using a furnace such as a vacuum furnace, a tube furnace, a crucible furnace, a muffle furnace, a salt bath, an oil bath, a water bath and so on, which are usually used by applying heat from the outside, in a vacuum, or in a flow of an inert, non-oxidizing atmosphere such as Argon gas and nitrogen gas, or of a reducing gas such as hydrogen gas.

Additionally, in the case of the combination of metal-metal and metal-semimetal, manufacturing is possible with a high-frequency induction furnace and an arc melting furnace as well. An atmosphere for melt molding depends upon a selected material and melt molding may be possible in the air at 500° C. or lower.

It is preferable to finally form the product, which is manufactured in the above steps, into a shape readily compressed as a precursor for multilayered body, for example, a flat rectangle solid and disc that includes a plate, a strip, a ribbon, a sheet, a coin, and a button.

(3) Rolling Step (Product Rolling Step)

As for this step, it is possible to adopt a typical method such as rolling, and cold rolling and hot pressing using uniaxial press. Rolling is particularly preferable with high compression efficiency. Rolling is possible at any of a warm temperature, at room temperature, and at a temperature lower than room temperature. The method using rolling at room temperature is particularly with high productivity.

A thickness of the multilayered body of the present invention is not particularly limited but is preferable at 5 $\mu$m to 1 mm. When a thickness is less than 5 $\mu$m, an even multilayer is hard to obtain. Moreover, when a thickness is larger than 1 mm, the number of times of rolling increases in the rolling step (described later) of the multilayered body, resulting in lower productivity. A thickness of the multilayered body is more preferable at 10 to 500 $\mu$m.

Besides, as the method of manufacturing the precursor for multilayered body, the following methods are also used: a method of rolling the combination of a sheet material and powder material and a method of directly supplying mixed powder between rolls and between presses to perform rolling in the case of rolling. When mixed powder is directly rolled, sheath pressing is preferable, in which rolling is performed in a state having mixed powder placed between metallic plates or covered with a metallic sheet, or in a state having mixed powder placed in a metallic tube with or without both ends being sealed. According to these manufacturing methods, the compression molding step may be omitted. In this case, industrial productivity can be improved.

The precursor for multilayered body can be manufactured by the above-mentioned manufacturing methods. When the material is a sheet-type of a commercial product, the material can be directly used as the precursor for multilayered body.

The precursor for multilayered body manufactured by the above examples is formed into a thermoelectric material by the following methods.

First, the precursor for multilayered bodies whose dimensions are cut and aligned as necessary are stacked {(4) stacking step} to form an initial multilayered body and the multilayered bodies are subjected to rolling {(5) rolling step} to obtain a rolled multilayered body. The rolled multilayered body is further stacked {(6) multiple stacking step} and rolled {(7) multiple rolling step} to form multiple rolled multilayered bodies. Hence, the configuration can further reduce an average thickness of the laminar body. It is also possible to repeat the (6) multiple stacking step and (7) multiple rolling step.

In the present invention, an operation including the (6) multiple stacking step and (7) multiple rolling step is referred to as repeated rolling. The number of repeated times is counted by adding one time of the (5) rolling step to the number of times of the (6) multiple stacking step and (7) multiple rolling step. For example, when a thermoelectric material is formed after (4) stacking step→(5) rolling step, the number of times of repeated rolling is one. In the case of (4) stacking step→(5) rolling step→(6) multiple stacking step→(7) multiple rolling step, the number of times of repeated rolling is twice. In the case of (4) stacking step→(5) rolling step→(6) multiple stacking step→(7) multiple rolling step→(6) multiple stacking step→(7) multiple rolling step, the number of times of repeated rolling is three times.

In general, as the number of times of repeated rolling increases, an average thickness D of the laminar bodies making up the thermoelectric material. At a thickness, an average thickness D may not change even when repeated rolling is carried out. For example, sheets of precursor for multilayered bodies, which are respectively made of Ag and Ni with a thickness of several tens $\mu$m, are alternately stacked for several hundreds sheets and are rolled at room temperature. In this case, when rolling is repeated for more than three times, a thickness of the laminar body is fixed between 1 to 5 nm and does not decrease any more.

Further, by increasing the number of times of repeated rolling, the laminar bodies may be aligned in thickness and structure may be uniformed even when a thickness d of the laminar body or an average thickness D of the laminar bodies does not largely change. Because of such an effect, a variety of thermoelectric performances can be also improved.

The following will discuss the detail of the method of manufacturing the thermoelectric material from the precursor for multilayered body.

(4) Stacking Step

As described above, the laminar bodies for forming the thermoelectric material of the present invention are made of a material being capable of plastic deformation. A precursor for multilayered body made of a metal, a semimetal, and a thermoplastic resin is preferable because plastic deformation can be performed thereon with great ease.

When a commercial sheet-type precursor for multilayered body is used, the precursor for multilayered body can be used as it is or used by cutting into suitable sizes and a variety of surface treatments such as a cleaning operation, a heating operation, a coupling operation, an acid operation, and a degreasing operation. For example, the following methods are effective: a method of cleaning the surface of the sheet-type material, which is made of Fe and Ag with a thickness of several tens μm, by acid treatment, cutting the material into a square of several centimeters, and stacking it after the degreasing treatment using hydrocarbon solvent, and a method of improving the bonding in the warm or cold rolling step using an uniaxial press and a roller.

When the precursor for multilayered body made of a single raw material is selected, two or more kinds of precursor for multilayered bodies are firstly stacked in an alternate manner to form the initial multilayered body. The number of precursor for multilayered bodies to be stacked depends upon a thickness. The number is preferable at 2 to 10000 and more preferable at 10 to 1000. When the number of the precursor for multilayered bodies is less than 10, the number of times of repeated rolling is increased to achieve the configuration of the present invention. When the number exceeds 1000, the number of times of rolling can not be reduced relative to a long time required for the stacking step. Thus, productivity is lowered in both cases. When the number exceeds 10000, the tendency becomes more outstanding, resulting in lower productivity and poor practicality.

Meanwhile, in the case of the precursor for multilayered body manufactured from two or more kinds of powder raw materials, it is possible to perform the stacking step without the necessity for combining different kinds of the precursor for multilayered bodies.

(5) Rolling Step

In the present invention, as a rolling method, it is possible to adopt a typical method such as rolling, cold rolling using a uniaxial press, and hot pressing as well as the rolling step (product rolling step) of (3). Particularly, rolling is a preferable method with high rolling efficiency. Rolling is possible at any of a warm temperature, at room temperature, or a temperature lower than room temperature. A method using rolling at room temperature is particularly preferable with high productivity.

In the present invention, an average thickness of the rolled multilayered bodies needs to be one fourth to one thousandth of an average thickness of initial multilayered bodies before rolling starts. When the thickness ratio exceeds one fourth, more cycles of stacking-rolling are necessary, and when the thickness ratio is smaller than one thousandth, the material becomes brittle and the multilayered structure becomes extremely irregular.

When rolling is used, an average thickness D of the rolled multilayered bodies at the end of the rolling step is determined by a gap or a clearance between rolls, a draft serving as a rate of change of the gap or clearance, a rolling temperature, a temperature of a test sample, a load applied upon rolling, a rotating speed of the roll, the number of times of passage between the rolls and so on. When these conditions are controlled and a desired thickness of the rolled multilayered body or a desired multilayered structure is achieved, the rolling step is completed. In the present invention, when the number of times of rolling is counted, the number of times of passage between the rolls is not counted, but it is assumed that one time of the rolling step is completed when rolling is made to a predetermined target thickness.

When an average thickness D of the laminar bodies making up the rolled multilayered body is 1000 nm or less after rolling, the multilayered structure of the repeatedly stacked laminar bodies may be destroyed. In the case of the combination of metals, the repeated multilayered structure hardly loses its shape until D=100 nm. However, when D is smaller than 100 nm, the above risk exists. In this case, the above phenomenon can be prevented by using the aforementioned sheath rolling method. Additionally, a sheath rolling method such as hot pressing using a uniaxial press is also available and a method of adjusting a test sample is the same as sheath rolling performed according to rolling.

It is preferable to carry out the rolling step at room temperature in view of productivity. However, rolling at a warm temperature is preferable for some materials. As a method of warm rolling, the following methods are adopted: a method of heating the roll itself, a method of heating an atmosphere at the front and rear of the roll or a holder of a test sample as well as the roll, a method of using heat, which appears when the rolled body itself is deformed, by adjusting a draft, a method of rolling after preheating a test sample in a hot plate, a constant temperature bath, a heating furnace, a salt bath, an oil bath, a water bath and so on, and a method having the above methods combined.

(6) Multiple Stacking Step

In this step, the same operation is carried out as the stacking step of (4) and the rolled multilayered body Is stacked once again. Normally, a ribbon-shaped rolled multilayered body obtained by rolling is cut and the same kind of many rolled multilayered bodies are stacked in this step. Unlike the stacking step of (4), it Is not always necessary to alternately stack different kinds of rolled multilayered bodies. Of course, it is also possible to appropriately select two or more kinds {stacking of different kinds of precursor for multilayered bodies is included in the stacking step of (4)} from the precursor for multilayered body, the rolled multilayered body, and multiple rolled multilayered body to stack multiple layers. The selection includes different kinds of a precursor for multilayered body and a rolled multilayered body, a rolled multilayered body and a another rolled multilayered body, and a precursor for multilayered body, a rolled multilayered body, and multiple-rolled-multilayered-bodies.

(7) Multiple Rolling Step

A rolled step having repeated rolling for two or more times is referred to as a multiple rolling step. Normally, the same operation as (5) rolling step is performed except that the multiple multilayered bodies are rolled instead of an initial multilayered body.

However, when the number of times of repeated rolling increases, an average thickness of the laminar bodies is normally reduced. Thus, care needs to be exercised to avoid a large increase in temperature when rolling. For example, in the case of the combination of Ag—Cu in which an average thickness of the laminar bodies is 100 nm or less, the configuration of the laminar body does not lose its shape even when rolling is performed at 600° C. in the rolling step. However, in the multiple rolling step, temperature control is necessary to avoid a temperature beyond 250° C.

In the present invention, the multilayered body is formed such that an average thickness D of the laminar bodies is set within a predetermined range by repeating stacking and rolling. For example, a thermoelectric material is obtained in which an average thickness of the multilayered bodies is 200 μm or more. In order to obtain such a thermoelectric material, there is no doubt that the thermoelectric material needs to undergo the process of FIG. 3. However, even at a midpoint of the process shown in FIG. 3, the thermoelectric material can be formed in a state of the precursor for multilayered body, in a state of the initial multilayered body, in a state of the rolled multilayered body, and in a state of the multiple multilayered body as long as the above multilayered body is obtained.

In the present invention, as described earlier, more effects are achieved by performing a heating operation after compression molding is made on mixed powder raw material, after melt molding is made, after a compression molded product is rolled, after the precursor for multilayered body is stacked, after the initial multilayered body is rolled, after the rolled multilayered body is stacked, and after the multiple multilayered bodies are rolled.

To be specific, the heating operation of the present invention is an operation performed under a normal atmospheric pressure or a pressure of 100 tonf/cm$^2$ or lower at 50 to 1000° C. An atmosphere for the heating operation can be selected from any of the following: a vacuum, an inert atmosphere such as Ar, He, and nitrogen gas, and a reducing atmosphere such as hydrogen gas and gas mixture of hydrogen/inert gas. The heating operation is possible in the atmosphere as well at a low temperature of 500° C. or lower.

However, an optimum temperature, pressure, time, and atmosphere of the heating operation vary among materials. It is preferable that a heating temperature is lower than a melting point of a layer having the lowest melting point among layers. At least an indispensable requirement is that a heating temperature is lower than the highest melting point of the layers. Further, in some configurations of the layers, the layers reacting to the heating operation may be adjacent to each other. When a brittle layer such as a semiconductor is deposited by reaction, the operation needs to be performed at a temperature lower than a reaction temperature.

The heating operation under a pressure is performed by using hot pressing and soon. At this moment as well, rolling is made such that an average thickness is entirely larger than one fourth and less than 1 before and after the heating operation. Thus, each of the laminar bodies making up the multilayered structure may increase in area and decrease in thickness. Although the multilayered material of the present invention is manufactured even when an applied pressure exceeds 100 tonf/cm$^2$, it is better to limit the pressure within a range permitting industrial use with ease. Hence, a pressure at 50 tonf/cm$^2$ or lower is more preferable.

When the heating operation is performed, the following occurs: <1> surface bonding of powder and/or the laminar body <2> relaxation of work hardening of powder and/or the laminar body <3> reaction or interdiffusion of powder and/or the laminar body, and so on.

When the surface bonding is performed on powder and/or the laminar body by the heating operation, the operation is desirable because exfoliation is less likely to appear on an interface in the rolling operation. Particularly in the case of the thermoelectric material of the present invention that including a metallic material, when the heating operation is performed on the compression molded product, the initial multilayered body, and the multiple multilayered bodies under an atmosphere of hydrogen, the operation is desirable because an interface is reduced and activated and bonding strength increases. This step may be indispensable for some kinds of the laminar bodies.

In the heating operation after compression molding is made on metal-metal or semimetal-mixed powder of metal, the case having the above <1> and <3> is particularly referred to as presintering. The presintering is a preferable heating operation in which cracks and exfoliation are less likely to occur when the precursor for multilayered body is prepared in the subsequent rolling step (product rolling step). However, when the adjacent laminar bodies react or cause interdiffusion and a brittle layer such as a semiconductor appears, the presintering is not preferable because exfoliation and destruction occur from the reacted layers in the subsequent rolling step.

In some cases, presintering is attained by performing the heating operation simultaneously with compression molding. In this case, a normally used method including an atmospheric sintering method, a hot pressing method, an HIP method, and an SPS method (discharging plasma sintering method) is selected.

As for relaxation of the work hardening of powder and/or the laminar body, according to the combination of raw materials, a desired thickness, and the configuration of the laminar bodies, the heating operation may be necessary. The selection of the heating conditions may be a decisive requirement of the performance and configuration of the thermoelectric material of the present invention. In order to select a raw material made of a transition metal such as Ag—Cu having high melting points, to cause no cracks during the rolling operation, and to obtain the multilayered structure of the laminar bodies each being 10 nm or less in thickness, it is more desirable to precisely control the heating conditions.

As an example of the heating conditions, the following will discuss an initial multilayered body in which sheet-type precursor for multilayered bodies, each being made of a starting raw material with a thickness of 50 μm, are alternately stacked with the combination of <1> Ag—Fe, <2> Ag—Cu, and <3> Cu—Fe. After the precursor for multilayered bodies are stacked, the heating operation is performed as follows: <1> in the case of the combination of Ag—Fe, (heated for one hour in an atmosphere of hydrogen at 600° C.) (heated for one minute in a vacuum under a pressure of 14 tonf/cm$^2$ at 300° C.)→(heated for one hour in an atmosphere of hydrogen at 600° C.), <2> in the case of the combination of Ag—Cu, (heated for one hour in an atmosphere of hydrogen at 350° C.)→(heated for one minute in a vacuum under a pressure of 7 tonf/cm$^2$ at 250° C.)→(heated for one hour in an atmosphere of hydrogen at 350° C.), and <3> in the case of the combination of Cu—Fe, (heated for one hour in an atmosphere of hydrogen at 350° C.)→(heated for one minute in a vacuum under a pressure of 12 tonf/cm$^2$ at 300° C.)→(heated for one hour in an atmosphere of hydrogen at 350° C.). After the heating operation, rolling is repeated for three times. Hence, it is possible to obtain a thermoelectric material in which the multilayered structure has laminar bodies each having a thickness of 5 to 20 nm.

In the heating operation, reaction or interdifusion occurs on powder body and/or an interface of the laminar body, and only an interface region or the powder body and/or the entire laminar body is made to form an intermetallic compound and/or a solid-melt substance. Hence, an alternate stacking material can be formed in the end, However, for example, when three kinds of precursor for multilayered bodies, which are respectively made of Sb, Te, and Bi, are stacked in the order of Sb→Te→Bi→Te→Sb, rolling is performed, and then, the heating operation is carried out in suitable conditions, it can be assumed that Bi and Te, and Sb and Te react from an interface and the multilayered structure is formed with two kinds of $Bi_2Te_3$ and $Sb2Te_3$ of the laminar bodies. However, these materials are very brittle and cannot be adopted as a practical thermoelectric material.

In the present invention, the heating operation can be performed simultaneously with (3) rolling step (product rolling step), (5) rolling step, and (7) multiple rolling step. In this case, it is preferable to dispose the compression molded product, the initial multilayered body, or the multiple multilayered body between molds made of a metal and/or a ceramic and to perform the above heating operation preferably in a state of evacuation or in inert gas at a high temperature of 50 to 1000° C. under a pressure of 0.01 to 100 tonf/cm² or less, which are dependent upon time required for rolling. Particularly in the case of the combination of metals, a pressure is preferable at 1 to 100 tonf/cm² or less and is more preferable at 25 to 100 tonf/cm² or less.

DETAILED DESCRIPTION OF THE INVENTION

Embodiment of Thermoelectric Element

Figure 1:
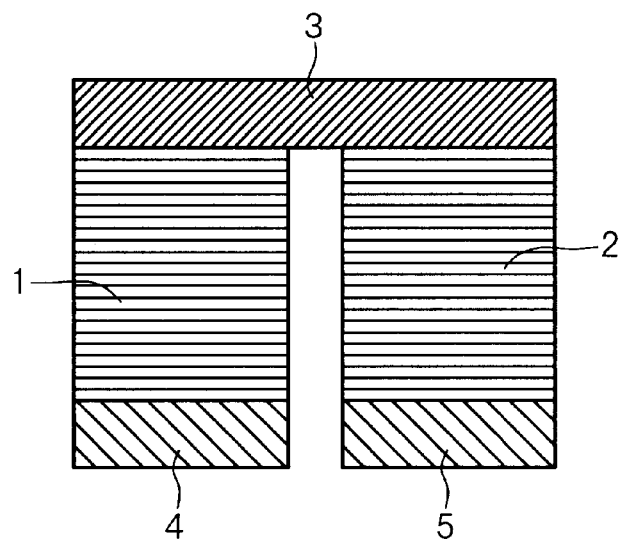
FIG. 1 is a sectional view showing an embodiment of a thermoelectric element of the present invention.
Figure 2:
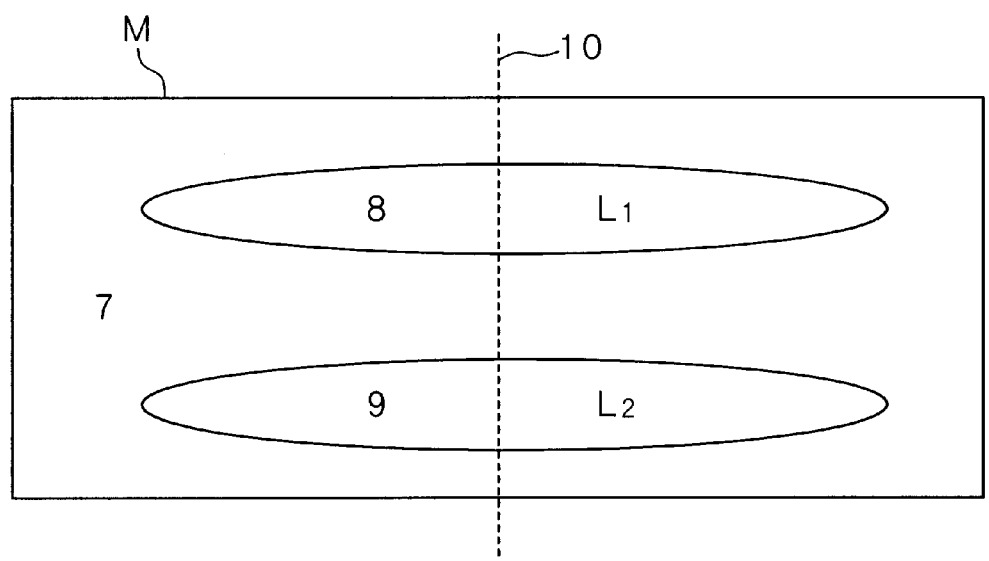
FIG. 2 is a diagram for explaining a method of counting the number of stacked layers of laminar bodies.
Figure 3:
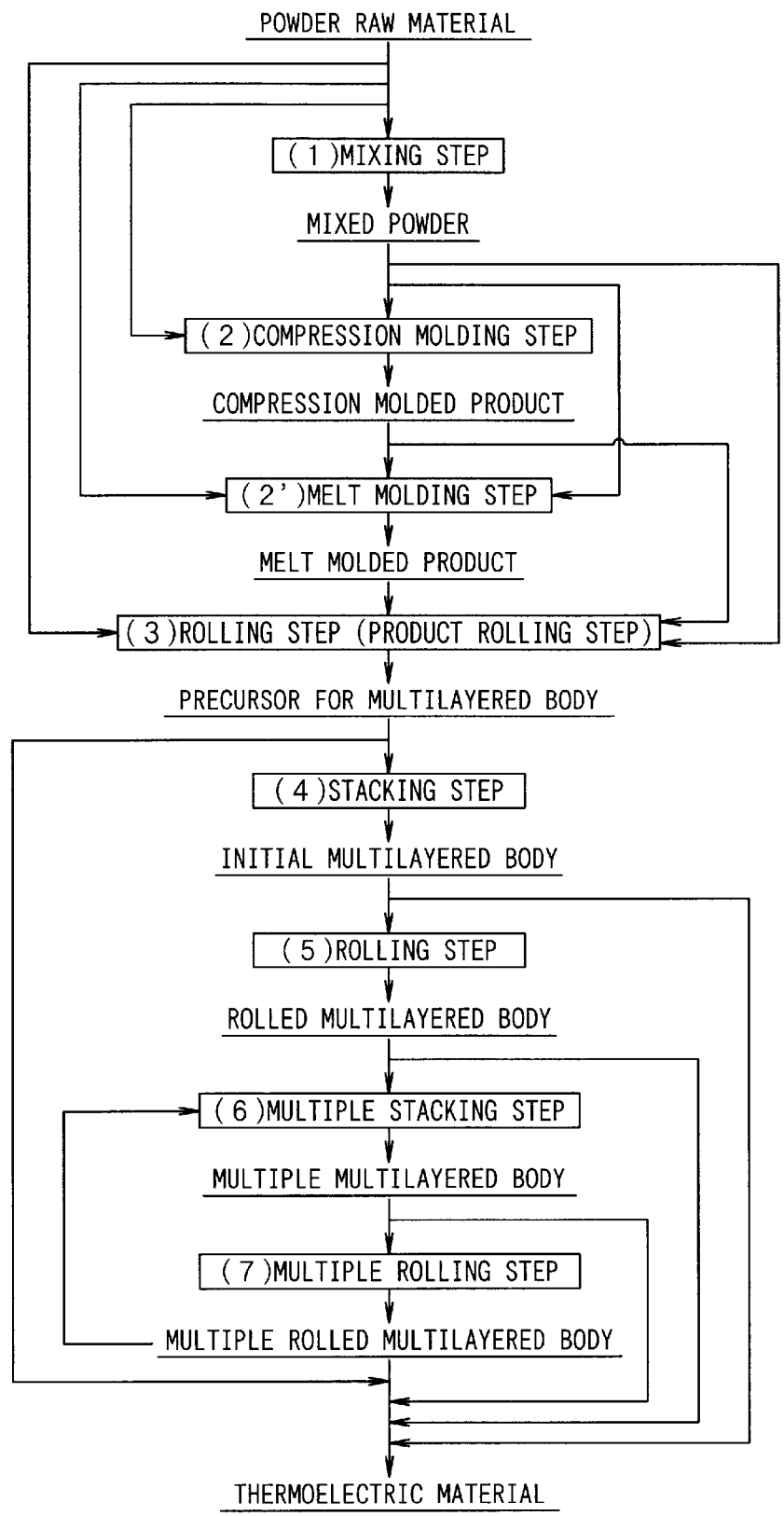
FIG. 3 is a diagram for explaining a method of manufacturing a thermoelectric material and a multilayered body making up the thermoelectric element of the present invention.

FIG. 1 is a sectional view showing an embodiment of a thermoelectric element of the present invention. The themo-electric element is a unit configuration of a thermoelectric cooling element, a thermoelectric power generating element, and an element for a variety of sensors. The thermoelectric element is composed of a thermoelectric material 1 having a positive Seebeck coefficient, a thermoelectric material 2 having a negative Seebeck coefficient, and electrodes 3 to 5.

In the thermoelectric element of the present invention, as a thermoelectric material made up of a laminar body of the present invention, a single thermoelectric material having a positive or negative Seebeck coefficient is used, and the thermoelectric element includes an element having electrodes disposed on both ends in a thickness direction of the laminar body or both ends along a film surface of the laminar body. The thermoelectric element includes an element used with a temperature difference appearing on both ends in a thickness direction of the laminar body or on both ends along the film surface of the laminar body.

The following will discuss how a thermoelectric cooling element using the thermoelectric material of the present invention is advantageous in practical use as compared with a thermoelectric element manufactured by a conventional film-forming technique.

As for the thermoelectric element shown in FIG. 1, total heat flow on a low-temperature bonding surface is expressed by the following equation (4)

$$dQ/dt = \pi I - \kappa(A/L)\Delta T - 1/2 I^2 \rho(L/A) \quad (4)$$

In the above equation, Q represents a quantity of absorbed heat on the bonding surface, π represents a Peltier coefficient (=αT), A represents an area of the bonding surface, L represents a longitudinal length of the element, T represents a temperature of the bonding surface, and ρ represents an electrical resistivity. The first term on the right side of the above equation represents Peltier heat, the second term represents heat backflow caused by conduction of heat, and the third term represents Joule's heat. According to the above equation (4), quantitatively, Joule's heat is smaller as A/L is small, and heat backflow can be reduced as A/L is small.

Therefore, A/L has an optimum value. A performance coefficient COP, which is an index being indicative of cooling efficiency, is expressed by the following equation (5).

$$COP = (dQ/dt)/\text{Input power} \quad (5)$$
$$= (dQ/dt)/IV$$
$$= (dQ/dt)/(I \ (IR + |\alpha \Delta T|))$$

Since the above equation [5] is a quadratic function of current, a current value $I_0$ exists with a maximum quantity of absorbed heat. According to d (dQ/dt)/dI=0, the following equation (6) is established.

$$I_0 = \pi(A/L)/\rho \quad (6)$$

According to the above equation (6), it is necessary to apply large current to an element having large A/L. Further, a temperature difference ΔT between a low-temperature part and a high temperature part is expressed by the following equation (7).

$$\Delta T = Q/(\kappa \cdot A/L) \quad (7)$$

According to the above equation (7), the larger A/L is, the smaller obtained temperature difference is.

As described above, A/L of the element has an optimum value. When A/L is fixed at the optimum value, A can be raised as L is larger. In order to satisfy demanded performance for a refrigerator, in which a temperature difference from room temperature is kept at a fixed difference or more, when L is small, it is necessary to sufficiently reduce A to set A/L close at an optimum value. Moreover, in the case where a quantity of current is limited in a household at appliance, actually, smaller A/L is more advantageous in many cases.

The thermoelectric material of the present invention can form a thermoelectric element having L of 200 µm or more. Thus, when A is adjusted by mechanically cutting and polishing, even in the case of a shape which can be manufactured in view of the cost, for example, a shape of 0.25 mm² or more, it is possible to obtain sufficiently large ΔT, and it is possible to set A/L at an optimum value at some values of π and ρ.

Meanwhile, if a conventional film-forming technique is used and current is applied in a thickness direction of the laminar body to form a thermoelectric material to be used, since practically available L is 2 µm or less, A is 0.0025 mm² or less. Thus, it is difficult to perform processing by mechanical cutting and polishing.

Therefore, in practical use, only the thermoelectric material of the present invention can form a thermoelectric cooling element for applying current in a thickness direction of the laminar body, and the thermoelectric material includes a factor achieving remarkable effect unlike the conventional technique. Namely, as for a bulk material as well, it is possible to industrially achieve a thermoelectric material, which has a repeated multilayered structure of a sub-nanometer or a nanometer to several tens nanometers, and the order of several tens nanometers to several hundreds nanometer, and an element using the thermoelectric material by using a classical rolling method. The multilayered structure has been achieved only by thin-film technique.

Besides, when the thermoelectric material of the present invention, which combines metals, is used for a variety of sensors, a sufficient function cannot be obtained without a material using a Seebeck coefficient (a) in a perpendicular direction to a film surface. However, starting with an Ag—Fe multilayered body, in the case of the configuration of the present invention, a material does not need to be composed only of a precious metal. Moreover, since sufficiently excellent performance can be achieved without using a multicomponent alloy, the present invention is advantageous industrially. Besides, without using a thin-film forming technique, it is possible to readily form foil of a wide range of 200 µm or more. As well as a combination of semimetal-metal, the present invention is effective for application such as sensing a temperature on a large area, thermoelectric cooling on a part having a curvature, and thermoelectric power generation.

The following will discuss interaction between the thermoelectric material of the present invention and a magnetic field.

It is observed that when metals of the materials of the present invention are mainly combined, in the case where a permanent magnet and a coil generates a magnetic field of 10 (Oe) to 20 (kOe) and the magnetic field is applied to a thermoelectric element, various thermoelectric performances are improved by about 1% to 200%. In the case of Ag—Fe, it is found that the application of a 10 (kOe)-magnetic field increases a Seebeck coefficient by about 20%. In some cases, it is confirmed that the combination of raw materials increases a Nernst coefficient or an Ettingshausen coefficient. In order to apply a magnetic field to the thermoelectric material of the present invention to further improve various thermoelectric performances, it is important to contain a component having magnetic properties, particularly a metal component having magnetic spin.

Embodiment 1, Comparative Examples 1 to 3

As a precursor for multilayered body, 100 sheets each being made of Ag with a thickness of 30 µm and dimensions of 20 mm×15 mm and 100 sheets each being made of Fe with a thickness of 25 µm and dimensions of 20 mm×15 mm were prepared. The sheets were alternately stacked to form an initial multilayered body. The initial multilayered body was heated in a vacuum at 600° C. for one hour while it was sandwiched between alumina plates.

Next, the initial multilayered body was subjected to hot pressing in a vacuum at 300° C. to reduce a thickness of the initial multilayered body to about a half. And then, the multilayered body was heated again in a vacuum at 600° C. for one hour. Thus, the initial multilayered body having laminar bodies bonded on its surfaces (pre-sintered) was obtained.

Subsequently, the initial multilayered body was rolled to about a one fiftieth thickness by a roller at room temperature. The rolled product (rolled multilayered body), that is, a multilayered body having one-time repeated rolling is defined as a first multilayered body.

Further, the rolled multilayered body was cut to form a number of rolled multilayered bodies with dimensions of 10 mm×15 mm. 100 rolled multilayered bodies were stacked (multiple multilayered body) and were subjected to hot pressing to reduce a thickness of multiple rolled mutilayered bodies to about a half. And then, after the rolled multilayered bodies were heated in a vacuum at 600° C. for one hour, they were rolled at room temperature to about a thickness of one fiftieth by a roller. The rolled product (multiple rolled multilayered bodies), that is, a multilayered body having repeated rolling twice is defined as a second multilayered body.

Moreover, the multilayered body was cut to form a number of multiple rolled mutilayered bodies with dimensions of 10 mm×15 mm. 100 multiple rolled multilayered bodies were stacked (multiple multilayered bodies) and were placed in a tube made of stainless steel, and sheath rolling was performed on the multiple mulilayered bodies without heating. The multiple multilayered bodies subjected to sheath rolling, that is, the multilayered body having repeated rolling for three times is defined as a third multilayered body.

The first to third multilayered bodies manufactured as described above were cut to manufacture a test piece for measuring thermoelectric power. Thermoelectric power was measured along a film surface of the multilayered body (film surface direction=CIP direction) and along a direction perpendicular to a film surface of the multilayered body (direction perpendicular to a film surface=CPP direction) The dimensions of a test piece for measuring a CIP direction are 20 mm×3 mm×60 µm. The dimensions of a test piece for measuring a CPP direction are 1×1×7 mm.

Figure 4:
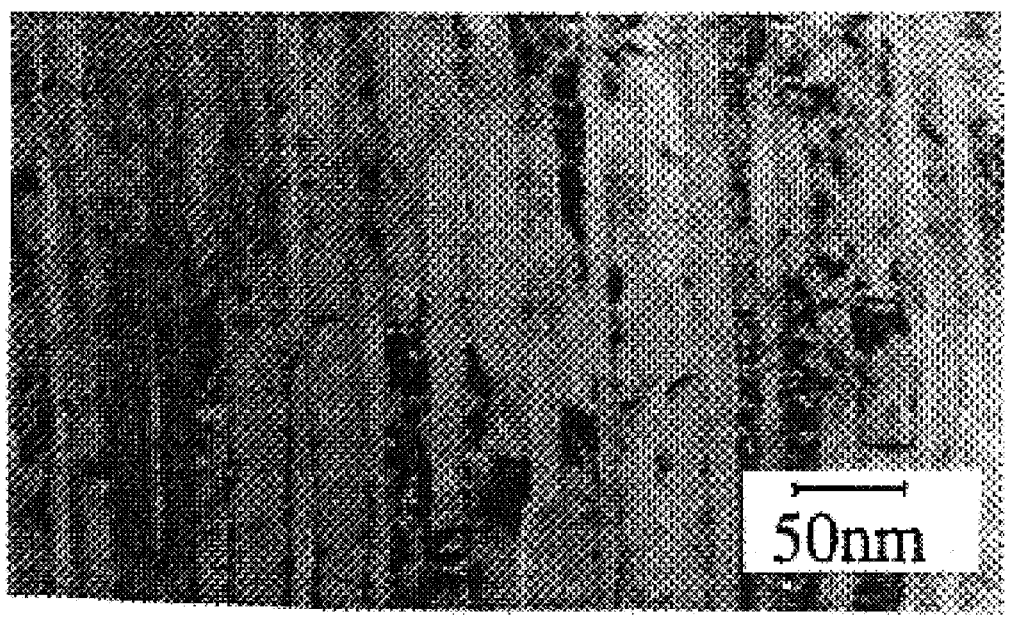
FIG. 4 is a photograph showing the metallic structure on a section of a test piece for measuring a CIP direction of the multilayered body made up of an Ag laminar body and an Fe laminar body (sheet of Ag and Fe are used as precursor for multilayered bodies)

FIG. 4 is a photograph showing the structure of a sectional view of the test piece for measuring a CIP direction (photograph showing an example of the sectional view observed by a transmission electron microscope) of the second multilayered body (mutilayered body having repeated rolling twice).

Figure 5:
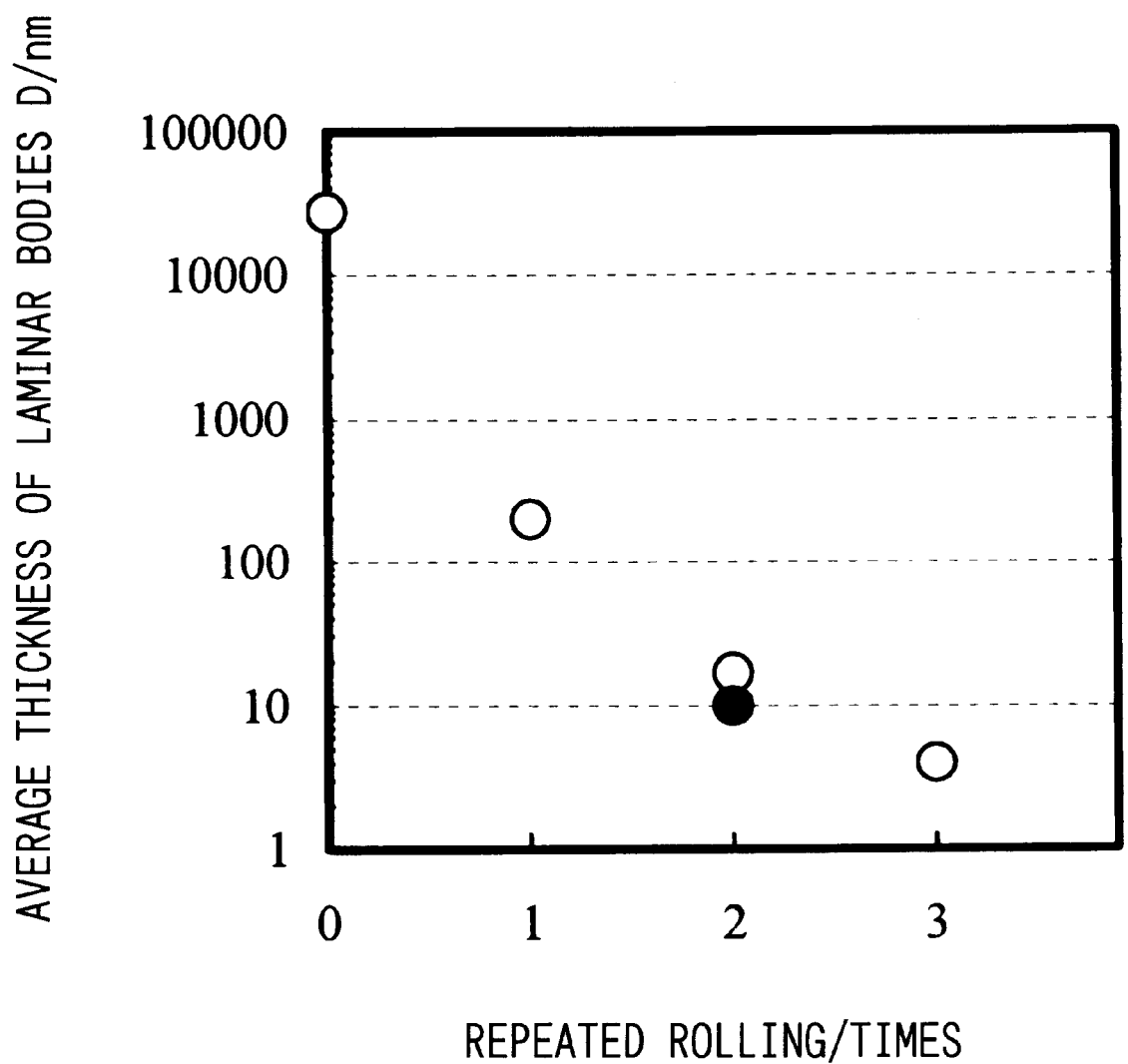
FIG. 5 is a graph showing the relationship between the number of times of repeated rolling of the multilayered body and an average thickness D of the laminar bodies.

FIG. 5 is a graph showing the relationship the times of rolling on the multilayered body and an average thickness D of laminar bodies (average value of an Ag laminar body and an Fe laminar body that make up the corresponding multilayered body: nm). In the graph, a value indicated by "○" is a value obtained by measuring a thickness of an Ag laminar body of the test piece for measuring a CIP direction. A value indicated by "●" is a value obtained by measuring a thickness of an Ag laminar body of the test piece for measuring a CPP direction. Here, in each of the multilayered bodies, a large difference was not found between the Fe laminar body and the Ag laminar body. Thus, a thickness of the Ag laminar body as it is was used as an average thickness D of the laminar bodies. Further, an average thickness D of the laminar bodies was an average thickness value of the Fe sheets and Ag sheets that make up the precursor for multilayered body when the number of rolling equals 0.

Figure 6:
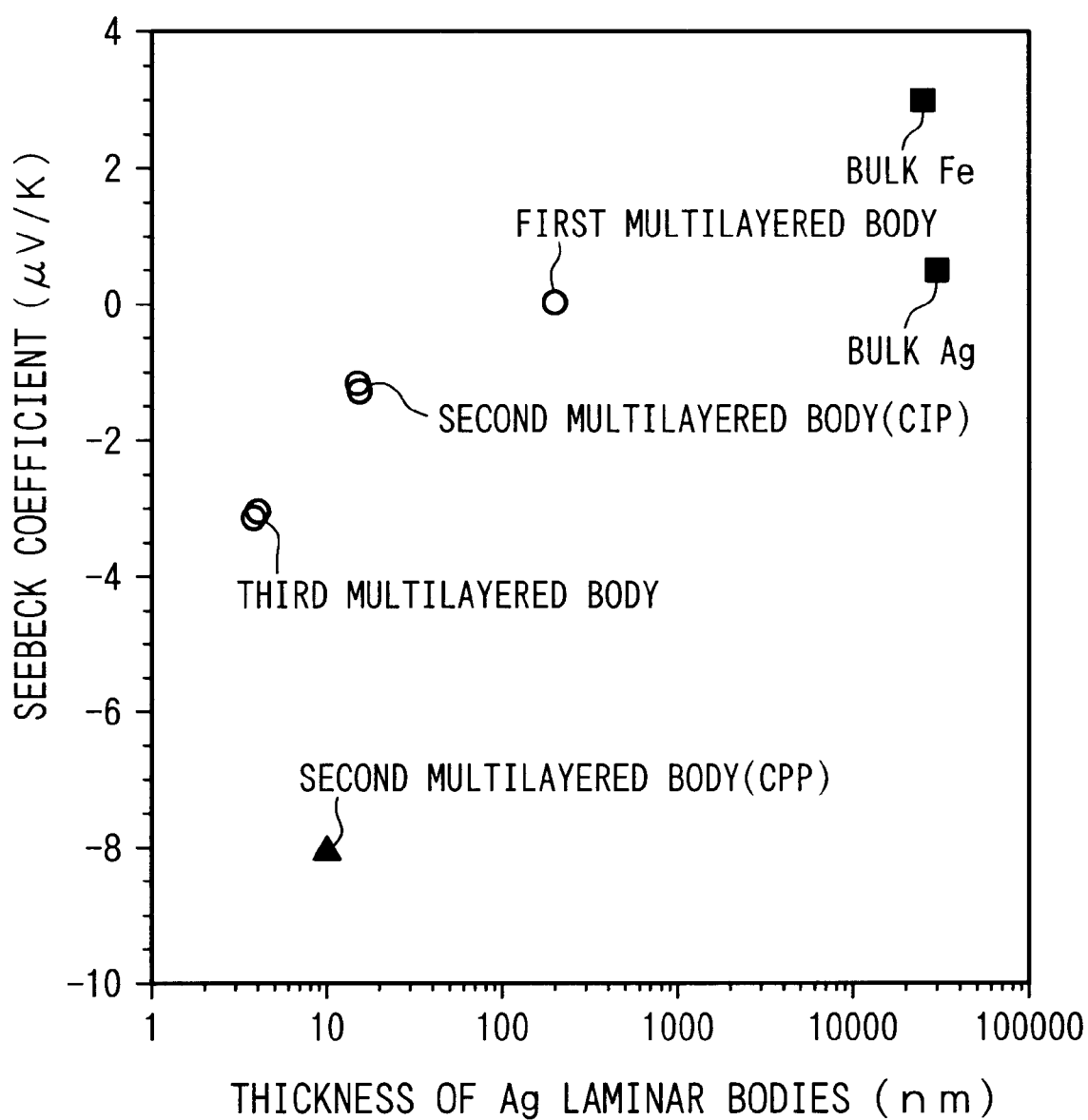
FIG. 6 is a graph showing the relationship of a thickness of the Ag laminar body and a Seebeck coefficient regarding the multilayered body made up of the Ag laminar body and the Fe laminar body.

Regarding the first to third multilayered bodies, as thermoelectric power, a Seebeck coefficient (thermoelectric power) was measured by using the test pieces in the environment of a liquid nitrogen temperature. FIG. 6 is a graph showing the relationship between a thickness of the Ag laminar body and a Seebeck coefficient. In the graph, two plots of a second laminar body and a third laminar body were provided because measurement was made on different two points in a film surface direction and the two points were plotted without averaging measured values.

According to the results of FIG. 6, the following facts were found on thermoelectric power at a liquid nitrogen temperature.
(i) While any one (bulk) of Ag and Fe had a positive Seebeck coefficient, the second and third multilayered bodies had negative Seebeck coefficients.
(ii) An absolute value of a Seebeck coefficient increased as a thickness of the Ag laminar body decreased.
(iii) In the second multilayered body, an absolute value of a Seebeck coefficient in a direction perpendicular to a film surface of the multilayered body (CPP) is larger than that along the film surface of the multilayered body (CIP) by about eight times.

Namely, in the multilayered body made up of the Ag laminar body and the Fe laminar body, when an average thickness of the laminar bodies is 100 nm or less and the thermoelectric element is configured such that current is applied in a thickness direction of the multilayered body or a temperature difference is made between both ends in a thickness direction of the multilayered body, it is possible to obtain especially good thermoelectric performance.

Besides, the first multilayered body corresponds to Comparative Examples 1, the second multilayered body (CIP) corresponds to Comparative Example 3, and the second multilayered body (CPP) corresponds to Embodiment 1.

Embodiment 2

350-mesh Ag powder and 300-mesh Fe powder of 20 grams in total were mixed with equal moles and were agitated in a mortar to make mixed powder. The mixed powder was subjected to compression molding by hydraulic pressing method. Hence, a disc-shaped compression molded body was manufactured with a diameter of 26 mm and a thickness of 5 mm. The compression molded body was heated at 700° C. for 48 hours to carry out pre-sintering. The compression molded body, which had been subjected to pre-sintering, was rolled to reduce a thickness to about one eightieth. The rolled body (sheet) was cut with equal sizes to obtain sixty multilayerted precursor for multilayered bodies.

Twenty of the precursor for multilayered bodies were stacked to obtain an initial multilayered body. The initial mutilayered body was heated in Ar atmosphere to remove work hardening. Next, the initial multilayered body was subjected to hydraulic pressing to form a rolled multilayered body. The rolled multilayered body is heated in Ar atmosphere to remove work hardening. And then, the rolled mulilayered body is cut to obtain sixty rolled multilayered bodies with a predetermined thickness. Twenty of the rolled multilayered bodies were stacked (multiple multilayered bodies), were placed in a tube made of stainless steel, and the multiple multilayered bodies were subjected to sheath rolling without heating. Thus, a multilayered rolled body was obtained.

Figure 7:
FIG. 7 is a photograph showing the metallic structure on a sectional view of a test piece for measuring a CIP direction of a multilayered body made up of an Ag laminar body and an Fe laminar body (precursor for multilayered body is manufactured from a powdered raw material)

As for the above multiple rolled multilayered bodies, a multilayered body having repeated rolling twice was manufactured by performing the same process as Embodiment 1. FIG. 7 is a photograph showing the metallic structure on a sectional view of the test piece for measuring a CIP direction of the multilayered body (photograph showing an example of the sectional view observed by a transmission electron microscope). According to comparison between the above photograph and that of FIG. 4, it is found that the multilayered body whose row material is powder as described in Embodiment 2 is substantially identical in sectional configuration to the multilayered body of Embodiment 1 whose row material is sheets.

Subsequently, the same process as Embodiment 1 is performed on the multilayered body to manufacture a multilayered body having repeated rolling for three times. When a test piece for measuring thermoelectric power was manufactured from the obtained multilayered bodies and a Seebeck coefficient was measured in a CIP direction and a CPP direction in the environment of a liquid nitrogen temperature, substantially the same results as Embodiment 1 were obtained. Further, in the above multilayered body as well, a large difference was not found in thickness between an Fe laminar body and an Ag laminar body.

Embodiments 3 and 4, Comparative Examples 4 to 8

25.8 g of Bi powder (99.99% purity) of 200 meshes or less and 14.2 g of Al powder (99% purity) of 200 meshes or less were put in a mortar with a volume ratio of Bi: Al=1:2 and a total weight of 40 g, and stirring was made in a hexane wet state. The process was repeated for six times to manufacture mixed powder, which is 240 g in total.

The mixed powder was subjected to compression molding by hydraulic pressing method to manufacture thirty disc-shaped compression molded bodies each having a diameter of 20 mm and a thickness of 6 to 8 mm. The compression molded bodies were divided into six groups, were put in an alumina board, and were heated at 900° C. for thirty minutes in an atmosphere of hydrogen gas of about 0.1 atm. Thus, a melting molded was obtained. The above heating operation is equivalent to a surface bonding operation. When the sectional view of the obtained melting molded body was observed by a scanning electron microscope (SEM), a fine configuration was observed in which dendritic crystals were dispersed in a Bi layer and a spherical precipitation phase of Bi is dispersed in an Al layer.

Subsequently, the melting molded body was subjected to hot pressing in a vacuum of 4 to 5 Pa in conditions of 230° C. and 0.3 tonf/cm$^2$ to reduce a thickness of the melting molded body to about a half. The melting molded body with a thickness of 6 mm was disposed between two SUS plates each having a thickness of 1.1 mm and were subjected to rolling while being heated at 160 to 190° C. Thus, a precursor for multilayered body was manufactured with a thickness of 80 μm.

The precursor for multilayered body was cut with dimensions of 20×20 mm to obtain 100 precursor for multilayered bodies. Next, the precursor for multilayered bodies were subjected to ultrasonic cleaning by using acetone and alcohol solvent. The cleaned 100 precursors for multilayered bodies were stacked to obtain an initial multilayered body.

And then, the initial multilayered body was subjected to hot pressing at 120° C. in a vacuum to reduce a thickness to about a half, and then, the initial multilayered body was subjected to rolling at room temperature. Hence, a rolled multilayered body was obtained with a thickness of 96 μm. The rolled multilayered body is equivalent to the first multilayered body having one-time repeated rolling.

The rolled multilayered body was cut with dimensions of 20 mm×20 mm and was subjected to the above-mentioned surface treatment. 50 multilayered bodies of these were stacked to obtain a multiple multilayered bodies. Subsequently, the multiple multilayered bodies were subjected to hot pressing at 100° C. in a vacuum, and then, the multiple multilayered bodies were subjected to rolling at room temperature to obtain multiple rolled multilayered bodies with a thickness of 110 μm. The multiple rolled multilayered bodies are equivalent to the second multilayered body having repeated rolling twice.

Figure 8:
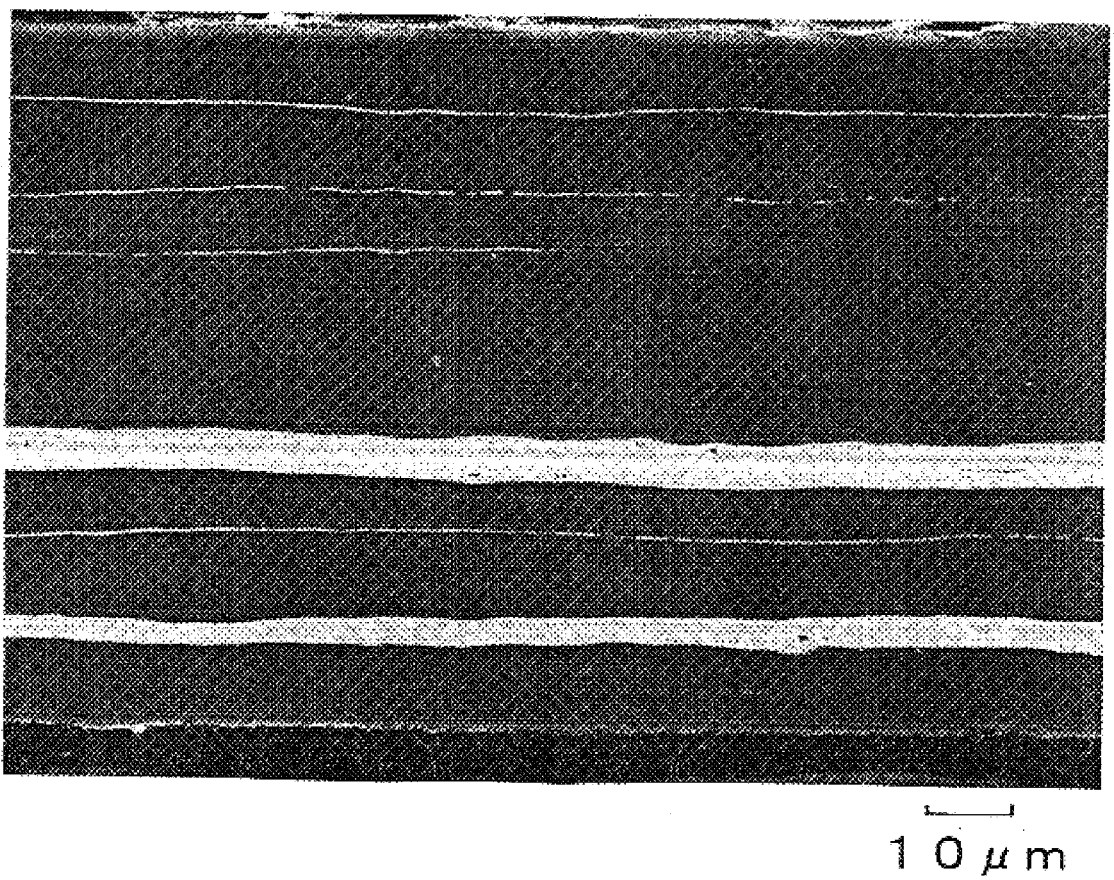
FIG. 8 is a photograph showing the metallic structure on a section of a test piece for measuring a CIP direction of the multilayered body obtained as Comparative Example 4.
Figure 9:
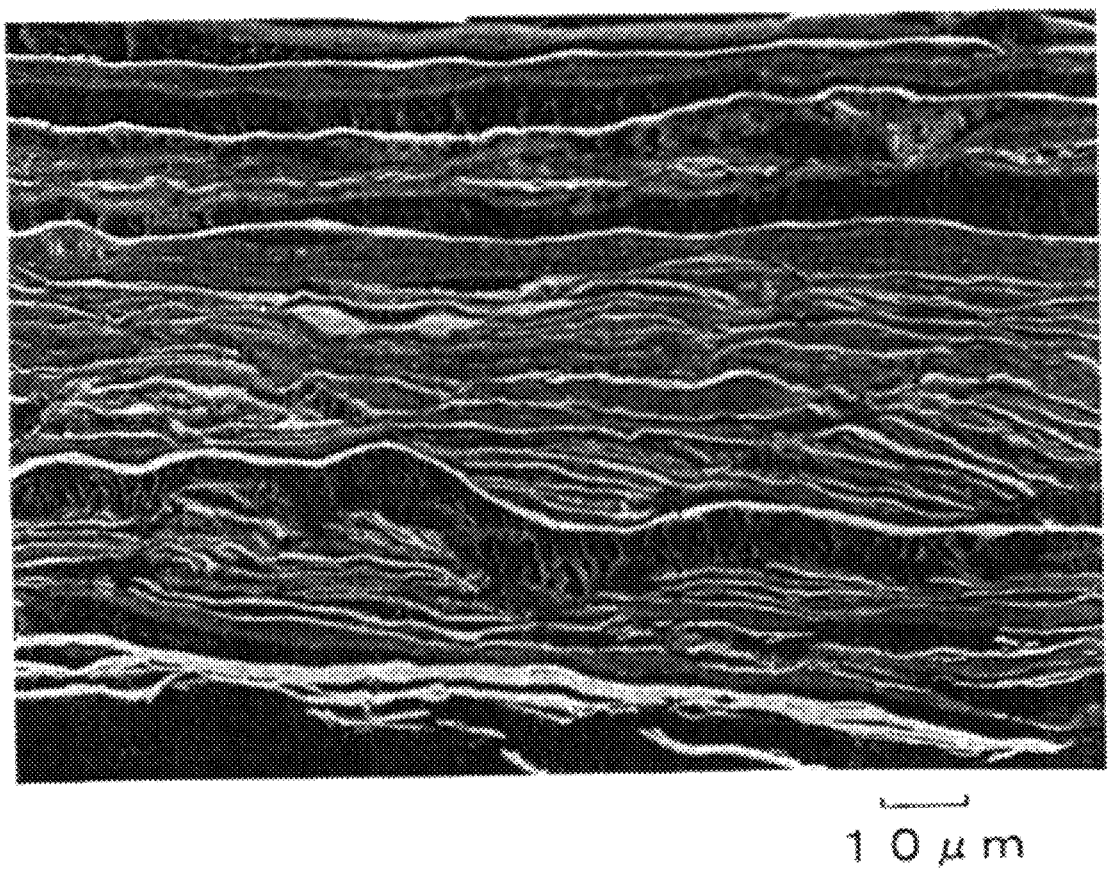
FIG. 9 is a photograph showing the metallic structure on a section of a test piece for measuring a CIP direction of a first multilayered body (the number of times of repeated rolling is one) obtained as Embodiment 3.
Figure 10:
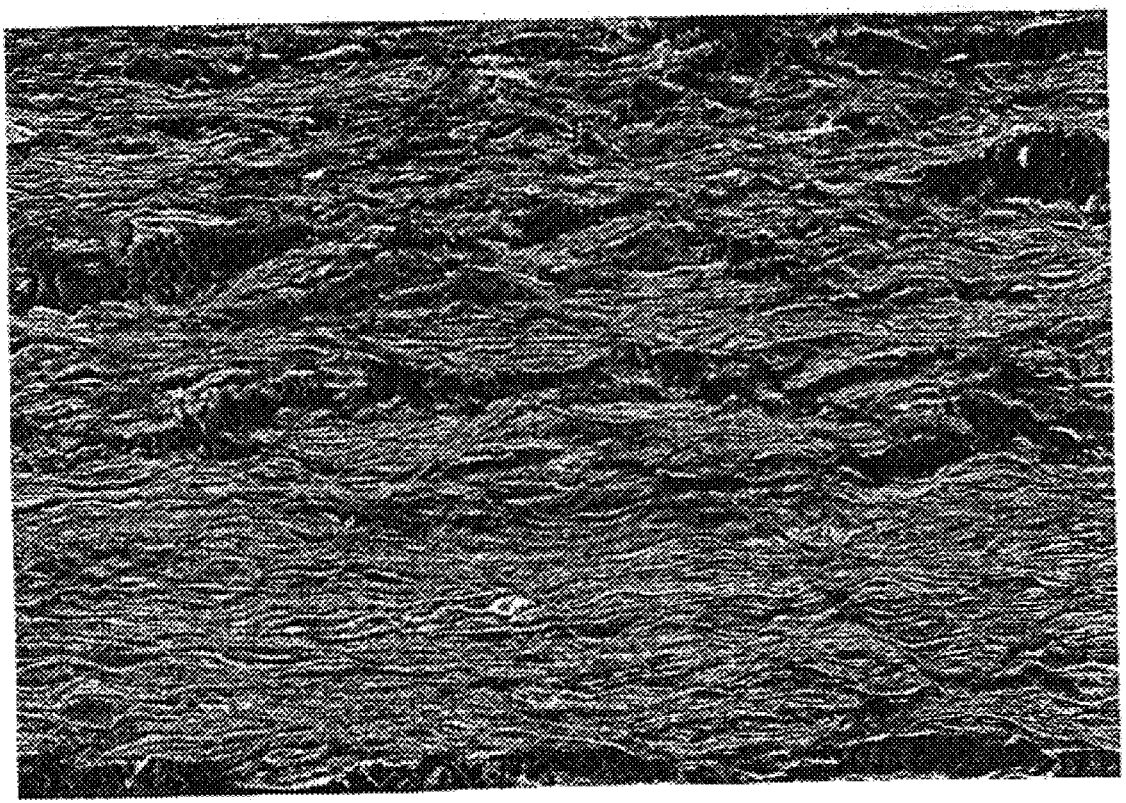
FIG. 10 is a photograph showing the metallic structure of a section of a test piece for measuring a CIP direction of a second multilayered body (the number of times of repeated rolling is twice) obtained as Embodiment 4.

The precursor for multilayered body, the first multilayered body, and the second multilayered body thus manufactured were cut to manufacture test pieces for measuring thermoelectric power in a CIP direction. FIGS. 8 to 10 show photographs showing the metallic structure of a sectional view of the test pieces (photograph showing an example of the sectional view observed by a scanning electron microscope). FIG. 8 is a photograph showing the precursor for multilayered body. FIG. 9 is a photograph showing the first multilayered body. FIG. 10 is a photograph showing the second multilayered body. An average thickness D of laminar bodies was measured by using the above photographs.

Moreover, a Seebeck coefficient (=thermoelectric power; α) and an electrical resistivity (ρ) were measured~t room temperature by using the above test pieces. Also, a power factor (PF) was computed by using the measurement values. Furthermore, an electrical conductivity (σ) was also calculated from the electrical resistivity. Besides, for comparison, the same measurements were made on a polycrystalline Bi elementary substance (Comparative Example 5), an Al elementary substance (Comparative Example 6), Bi2Te3 (Comparative Example 7), and an Ag—Fe rolled body (Comparative Example 8). Table 1 shows the measurement values and computed values.

As shown in Table 1, an average thickness D of the laminar bodies making up the precursor for multilayered body (Comparative Example 4) was 5000 nm. An average thickness D of the laminar bodies making up the first multilayered body (Embodiment 3) was 300 nm. An average thickness D of the laminar bodies making up the second multilayered body (Embodiment 4) was 100 nm.

Additionally, regarding the first multilayered body (Embodiment 3) and the second multilayered body (Embodiment 4), when an interface of the Bi laminar body was observed by a transmission electron microscope, an amorphous out-of-phase having a microcrystal in nanometer order dispersed was observed on all the Bi laminar bodies of the multilayered bodies.

Figure 11:
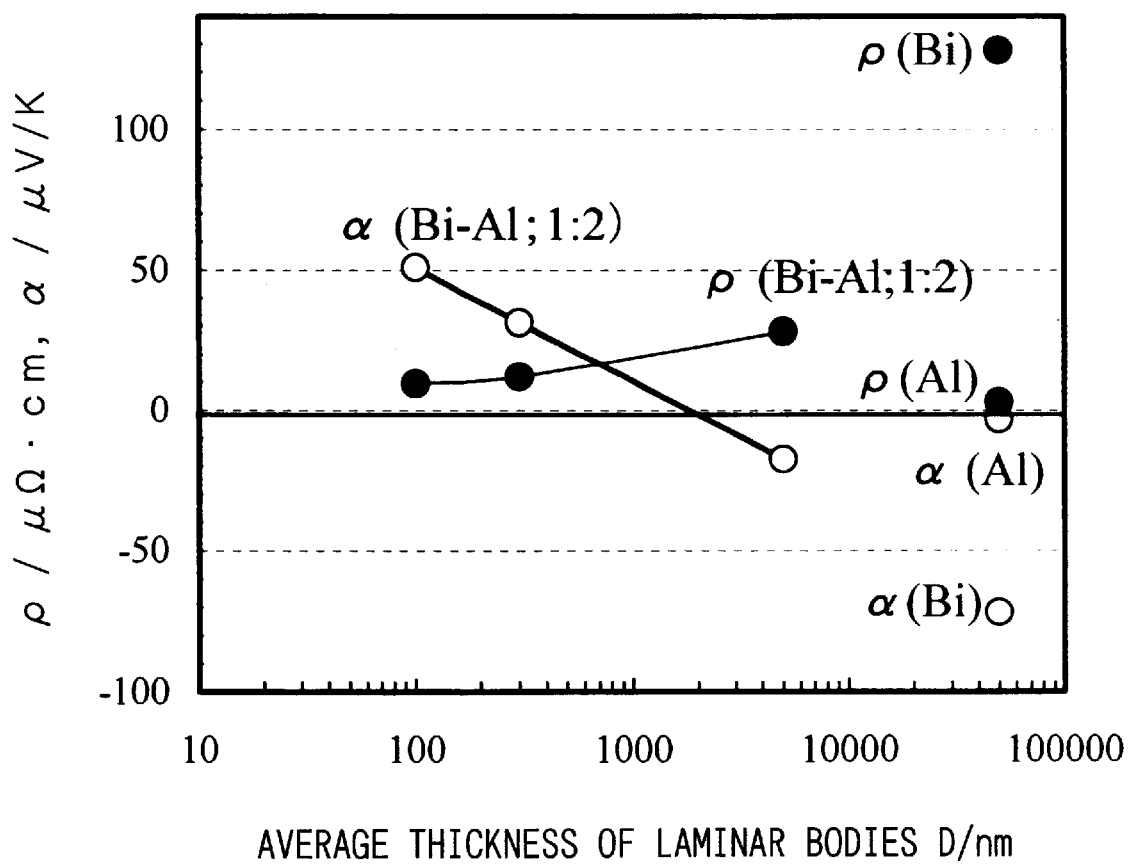
FIG. 11 is a graph showing the relationship between an average thickness D of laminar bodies and a Seebeck coefficient (α) and an electrical resistivity (ρ). In this graph, the results of Embodiments 3 and 4 and Comparative Examples 4, 5, and 6 are plotted. In this graph, "○" indicates a Seebeck coefficient and "●" indicates an electrical resistivity.

FIG. 11 is a graph showing the relationship between an average thickness D of the laminar bodies and a Seebeck coefficient (α) and an electrical resistivity (ρ). In this graph, the results of the Embodiment 3 and 4 and Comparative Examples 4, 5, and 6were plotted. In this graph, "○" indicates a Seebeck coefficient and "●" indicates an electrical resistivity.

Figure 12:
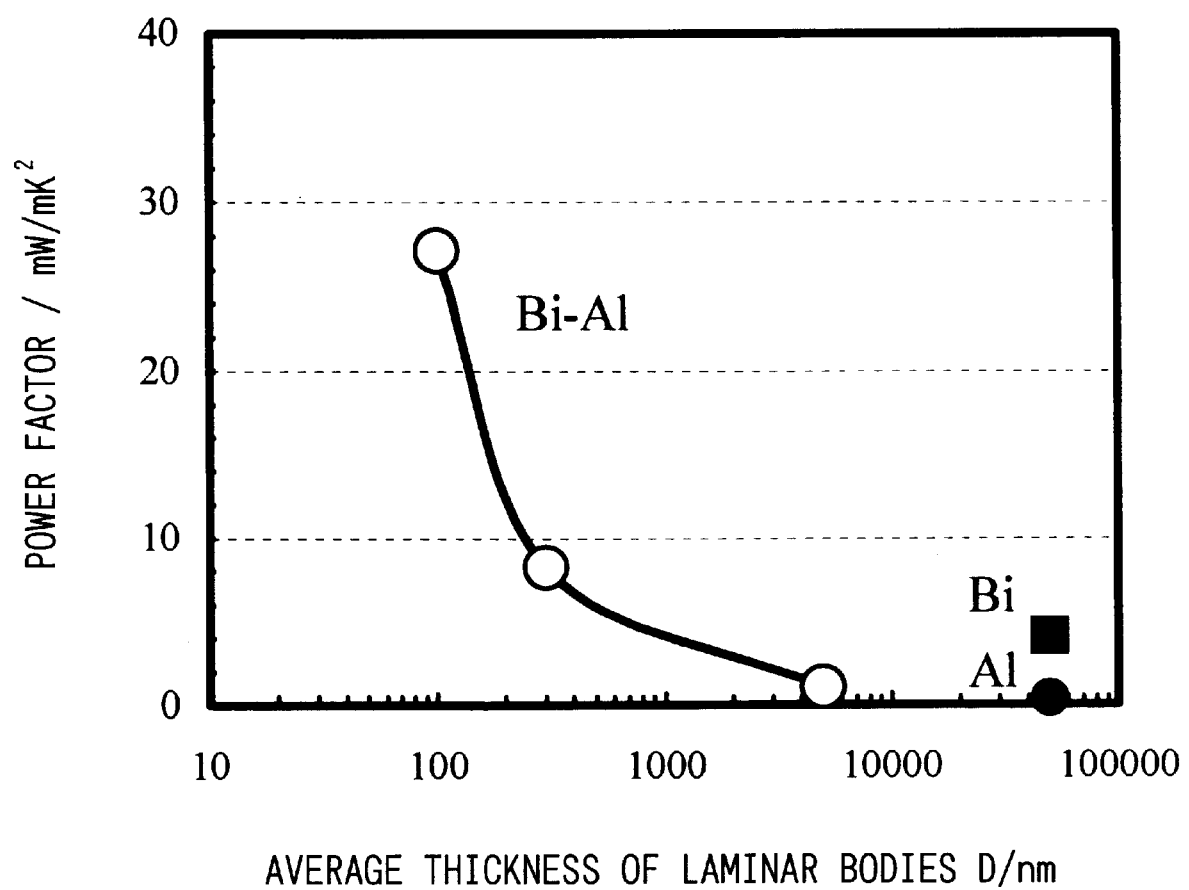
FIG. 12 is a graph showing the relationship between an average thickness D of the laminar bodies and a power factor (PF). In this graph, the results of Embodiments 3 and 4 and Comparative Examples 4, 5, and 6 are plotted.
Figure 13:
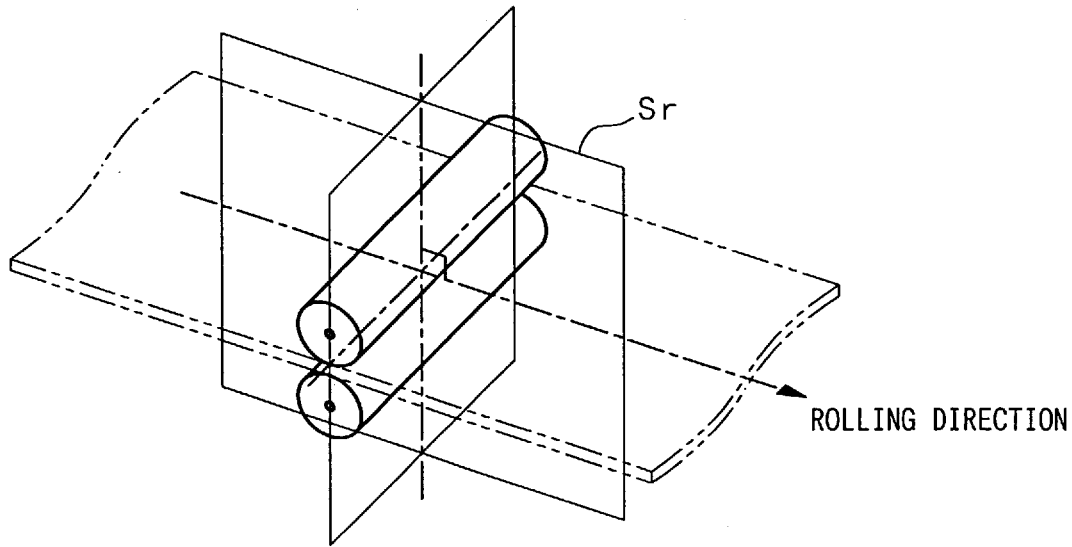
FIG. 13 is a diagram showing a reference surface ($S_r$) on a section of the multilayered body when the multilayered body is manufactured by rolling.
Figure 14:
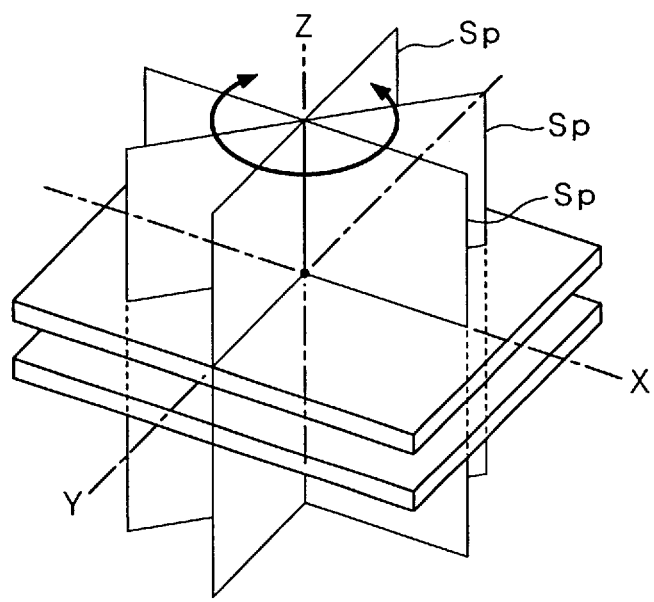
FIG. 14 is a diagram for explaining a reference surface ($S_p$) on a section of the multilayered body when the multilayered body is manufactured by uniaxial pressing.

FIG. 12 is a graph showing the relationship between an average thickness D of the laminar bodies and a power factor (PF). In this graph, the results of Embodiment 3 and 4 and Comparative Examples 4, 5, and 6 were plotted.

According to the results of FIGS. 11 and 12, the following facts were found regarding thermoelectric properties at room temperature.

(i) While any one (bulk) of Bi, which is a semimetal, and Al, which is a metal, had a negative Seebeck coefficient, the first multilayered body (Embodiment 3) and the second multilayered body (Embodiment 4) had positive Seebeck coefficients. This relationship is completely opposite from the resultant relationship of Embodiment 1 (the result of the multilayered body made of metal-metal at a liquid nitrogen temperature).

(ii) An absolute value of a Seebeck coefficient increased as an average thickness of the laminar bodies decreased.

(iii) Embodiments 3 and 4 had a good power factor along a film surface of the multilayered body (CIP direction) as compared with Comparative Examples 4 to 8. Namely, with the multilayered bodies of Embodiments 3 and 4, thermoelectric performance better than $Bi_2Te_3$ (semiconductor) was obtained in a CIP direction. Particularly, a value of Embodiment 4 was about seven times larger than that of Comparative Enbodiment 5 (polycrystalline Bi elementary substance).

(iV) The multilayered body containing a semimetal is remarkably higher in both of a Seebeck coefficient (α) and a power factor (PF) along a film surface direction (CIP direction) at room temperature as compared with the multilayered body (Comparative Example 8) having the combination of metals.

Embodiments 5 to 7

200 g of Bi powder (99.99 purity) of 200 meshes or less and 40 g of 12-nylon powder is put in a separable flask made of glass so as to have a volume ratio of Bi: 12-nylon=1:2 and a total quantity of 240 g. As the Bi powder, powder subjected to surface treatment with coupling agent was used.

While Argon was applied into the flask, the content of the flask was stirred by an impeller at about 240° C. for one hour. Thus, Bi powder was dispersed in the melted nylon. The compound composed of Bi and 12-nylon that was obtained in the above manner was subjected to pressure forming for three minutes in the conditions of 230° C. and 0.2 tonf/ cm². Subsequently, a pressure is changed to 1.4 tonf/cm²and pressure forming was performed for three minutes. Hence a multilayer precursor for multilayered body ws formed with a thickness of about 1 mm.

The precursor for multilayered body was cut to obtain a number of precursor for multilayered bodies with dimensions of 20×20 mm. 25 of the precursor for multilayered bodies are stacked to obtain an initial multilayered body. The initial multilayered body was subjected to hot pressing at about 150° C. in a vacuum to reduce a thickness to about one third. Next, the initial multilayered body was rolled while being heated at about 150 to 170° C. in a constant temperature bath, and its thickness is reduced to about 240 m. The rolled product (rolled multilayered body) is equivalent to the first multilayered body having rolling for one time.

When a sectional microstructure of the first multilayered body (rolled multilayered body) was observed by a scanning electron microscope (SEM), it was found that a flatness ratio was $\Psi=0.07$ and an average thickness D of the laminar bodies was 9000 nm.

The rolled multilayered body (first multilayered body) was cut to obtain a number of rolled multilayered bodies with dimensions of 20×20 mm. Forty of these rolled multilayered bodies were stacked and were subjected to hot pressing in a vacuum in the conditions of 150° C. and 0.3 tonf/cm². Thus, compression was made to reduce a thickness by about 40%.

And then, the rolled product was placed between two plates made of stainless steel and was rolled while being heated at 150 to 160° C. Thus, multiple rolled multilayered bodies were obtained with a thickness of 170 μm. The rolled product (rolled multilayered body) is equivalent to the second multilayered body having rolling twice.

When a sectional microstructure of the second multilayered body (multiple rolled multilayered bodies) was observed by a scanning electron microscope (SEM), it was found that a flatness ratio was $\Psi=10^{-3}$ and an average thickness D of the laminar bodies was 600 nm. The second multilayered body is defined as a multilayered body of Emboliment 5.

The same process as the rolled multilayered body (first multilayered body) was performed on the multiple rolled multilayered bodies (second multilayered body) except for the following different points. Hence, multiple rolled multilayered bodies were obtained with a thickness of 150 μm. The above multilayered bodies were different in that the number of stacked bodies was 45 and a pressure of hot pressing was 1.5 tonf/cm². The obtained multiple rolled multilayered bodies are equivalent to the third multilayered body having rolling for three times.

When a sectional microstructure of the third multilayered body (multiple rolled multilayered bodies) was observed by a scanning electron microscope (SEM), it was found that a flatness ratio was $\Psi=10^{-4}$ and an average thickness D of the laminar bodies was 300 nm. The third multilayered body is defined as a multilayered body of Embodiment 6. The third multilayered body had more even components as compared with the second multilayered body.

The obtained third multilayered body was cut to obtain a number of multilayered bodies with dimensions of about 3.5×7 mm. 100 of these multilayered bodies (third multilayered body) were subjected to compression molding in a hard metallic mold for compression molding that has an opening surface of 5×10 mm while a film surface of the multilayered body and the opening surface were aligned to each other. The compression molding was performed for three minutes at 120° C. and 3 tonf/cm² and then for five minutes at 70° C. and 5 tonf/cm². Thus, multiple multilayered bodies were obtained with dimensions of about 5×10× thickness 9 mm.

The multiple mutilayered bodies were cut into halves and stacked, and the same mold was used to perform compression molding. The compression molding was carried out at a temperature of 70 to 120° C. by gradually increasing a pressure. The obtained multiple multilayered bodies were defined as the fourth multilayered body.

When a sectional microstructure of the fourth multilayered body was observed by a scanning electron microscope (SEM), it was found that a flatness ratio was $\Psi=10^{-5}$ and an average thickness D of the laminar bodies was 90 nm. The fourth multilayered body was defined as a multilayered body of Embodiment 7.

The second and third multilayered bodies manufactured in the above manner were cut to manufacture test pieces for measuring thermoelectric power in a CIP direction. A Seebeck coefficient (=thermoelectric power; α) was measured at room temperature by using the test pieces. However, since current was not conducted in the first multilayered body, a Seebeck coefficient was not measured. As for the fourth multilayered body, thermoelectric power in a CPP direction was measured as it is.

Thermal conductivities (κ) of the second multilayered body (Embodiment 5) and the third multilayered body (Embodiment 6) were measured by the following method. First, five multilayered bodies were stacked and bonded to one another by pressing at 150° C. and about 1 tonf/cm² to have a thickness of 0.5 mm. Next, the bonded bodies were cut into test pieces each having a diameter of 10 mm. A thermoconductivity (κ) was measured by using the test pieces according to laser flash method.

A flatness ratio Ψ of the obtained was almost equal to the corresponding multilayered body in order. An average thickness D of laminar bodies of the obtained test pieces was almost equal to that of the corresponding multilayered body. Therefore, a thermal conductivity measured by the test piece is almost equal to a thermal conductivity of the corresponding multilayered body. Additionally, as for a thermal conductivity, three measurement values were obtained for each of the multilayered bodies and a largest value was used.

A flexibility test was conducted by using a disc-shaped test piece having a diameter of 10 nm and a thickness of 0.5 mm and a plate-type test piece having dimensions of 10 mm×7 mm×thickness 0.5 mm. When the test piece was broken after being bent by hand to 90°, it was indicated by "x", and when the test piece returned to the original shape, it was indicated by "○".

Further, for comparison, the same measurement was made on the above-mentioned polycrystalline Bi elementary substance (Comparative example 5) and $Bi_2Te_3$ (Comparative 7). The measurement values were shown in Table 2.

The following facts were found according to the results of Table 2.

(i) Since the multilayered body was made of Bi (semimetal) and 12-nylon (synthetic resin), a good flexibility was obtained as compared with a themoelectric material only composed of Bi(semimetal) or $Bi_2Te_3$ (semiconductor).

(ii) An absolute value of a Seebeck coefficient increased when an average thickness of the laminar bodies was 100 nm or less.

(iii) The multilayered body made of Bi (semimetal) and 12-nylon (synthetic resin) has a thermal conductivity (κ) which is as low as that of synthetic resin.

INDUSTRIAL APPLICABILITY

As described above, according to the present invention, a thermoelectric material has a high Seebeck coefficient (α) and a large power factor (PF) that shows possibility of a high-performance thermoelectric element. Besides, it is possible to provide the material with excellent shock resistance, thermal strain resistance, and formability.

TABLE 1

| | Material | Average thickness D of laminar bodies (nm) | α ($\mu$V/K) | ρ ($\mu\Omega$.cm) | σ (kS/m) | PF (mW/mK$^2$) |
|---|---|---|---|---|---|---|
| Embodiment 3 | Bi—Al (volume ratio 1:2) | 300 | 31.3 | 12.0 | 8330 | 8.2 |
| Embodiment 4 | Bi—Al (volume ratio 1:2) | 100 | 51.0 | 9.55 | 10500 | 27 |
| Comparative Example 4 | Bi—Al (volume ratio 1:2) | 5000 | −17.5 | 28.1 | 3560 | 1.1 |
| Comparative 5 | Bi | — | −72.0 | 128 | 782 | 4.1 |
| Comparative Example 6 | Al | — | −3.36 | 2.85 | 35100 | 0.4 |
| Comparative Example 7 | Bi$_2$Te$_3$ | — | 240 | 1660 | 60.2 | 3.5 |
| Comparative Example 8 | Ag—Fe (volume ratio 1:1) | 100 | 4.27 | 4.08 | 24500 | 0.4 |

TABLE 2

| | Material | Measurement direction of α | Average thickness D of laminar bodies (nm) | α ($\mu$V/K) | Flexibility test | κ (W/mK) |
|---|---|---|---|---|---|---|
| Embodiment 5 | Bi-12 nylon (volume ratio 1:2) | film surface direction | 600 | −75 | ○ | <0.2 |
| Embodiment 6 | Bi-12 nylon (volume ratio 1:2) | film surface direction | 300 | −75 | ○ | <0.2 |
| Embodiment 7 | Bi-12 nylon (volume ratio 1:2) | Perpendicularly to film surface direction | 90 | −116 | ○ | — |
| Comparative Example 5 | Bi | — | — | −72 | x | 16 |
| Comparative Example 7 | Bi$_2$Te$_3$ | — | — | 240 | x | 2 |

What is claimed is:

1. A thermoelectric material, comprising a multilayered body, the multilayered body comprising:
   one or more laminar bodies made of a metal, or a synthetic resin; and
   a laminar body made of a semimetal,
   wherein the laminar bodies have an average thickness of 0.3 nm to 1000 nm.

2. The thermoelectric material according to claim 1, wherein the multilayered body is composed of a laminar body made of a semimetal and a laminar body made of a metal.

3. The thermoelectric material according to claim 1, wherein the laminar body made of the metal is a laminar body made of any one of metals Ag, Fe, Cu. Ni, Al, Au, Pt, Cr. Zn, Pb, and Sn.

4. The thermoelectric material according to claim 1, wherein the laminar body made of the semimetal is a laminar body made of bismuth (Bi) and the laminar body made of the metal is a laminar body made of any one of metals Ag. Fe, Cu, Al, Zn, and Sn.

5. The thermoelectric material according to claim 1, wherein the multilayered body composed of a laminar body made of a semimetal and a laminar body is made of a synthetic resin.

6. The thermoelectric material according to claim 5, wherein the synthetic resin is a polyamide series resin.

7. The thermoelectric material according to claim 1, wherein the laminar body making up the multilayered body is discontinuous in a film surface.

8. The thermoelectric material according to claim 1, wherein the laminar bodies have an average thickness of 0.3 nm to 100 nm.

9. A thermoelectric element comprising a thermoelectric material according to claim 1.

10. The thermoelectric element according to claim 9, wherein said thermoelectric element is used by applying current in a thickness direction of the multilayered body or used by having a temperature difference between both ends in a thickness direction of the multilayered body.

11. A thermoelectric element comprising a multilayered body composed of two or more kinds of laminar bodies made of a metal, and
   the laminar bodies have an average thickness of 0.3 nm to 100 nm, and
   the thermoelectric element is used by applying current in a thickness direction of the multilayered body or used by having a temperature difference between both ends in a thickness direction of the multilayered body.

12. The thermoelectric element according to claim 11, wherein the laminar body making up the multilayered body is discontinuous in a film surface.

13. The thermoelectric element according to claim 11, wherein the laminar body is made of any one of metals Ag. Fe, Cu, Ni, Al, Au, Pt, Cr, Zn, Pb, and Sn.

14. The thermoelectric element according to claim 11, wherein said multilayered body is composed of a laminar body made of any one of metals, Fe, Ni, Al, Pt, Cr, and Sn; and a laminar body made of any one of metals Ag, Cu, Au, Zn, and Pb.

15. A method of manufacturing a thermoelectric material,
in which the material comprises a multilayered body composed of two or more laminar bodies, and the laminar bodies have an average thickness of 0.3 to 1000 nm,
wherein after making of an initial multilayered body composed of all kinds of laminar bodies makes up the multilayered body, a plurality of initial multilayered bodies are stacked and rolling or uniaxially pressing is performed to form the multilayered body.

16. The method of manufacturing a thermoelectric material according to claim 15, wherein a plurality of second multilayered bodies, which are obtained by stacking a plurality of the initial multilayered bodies and performing rolling or uniaxially pressing thereon, are stacked and rolled or uniaxially pressed once or repeatedly more than one time.

17. The method of manufacturing a thermoelectric material according to claim 15, wherein powder having an average particle diameter of 0.1 $\mu$m to 500 $\mu$m is used as a material of the laminar body, and after the powder is presintered, the initial multilayered body is formed.

18. A thermoelectric material according to claim 1, which is manufactured by the manufacturing methods described in claim 15.

* * * * *